US012637529B2

(12) United States Patent
Yun et al.

(10) Patent No.: US 12,637,529 B2
(45) Date of Patent: May 26, 2026

(54) RESIN COMPOSITION AND DISPLAY DEVICE USING THE SAME

(71) Applicant: Samsung Display Co., Ltd., Yongin-si (KR)

(72) Inventors: Wonmin Yun, Yongin-si (KR); Jieun Ko, Suwon-si (KR); Yohan Kim, Seoul (KR); Yisu Kim, Seoul (KR); Byoungduk Lee, Seongnam-si (KR); Seungju Lee, Suwon-si (KR); Jaehyuk Lee, Seoul (KR); Hyungdong Lee, Hwaseong-si (KR); Yoonhyeung Cho, Yongin-si (KR); Hyeonseo Cho, Asan-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 1099 days.

(21) Appl. No.: 17/548,151

(22) Filed: Dec. 10, 2021

(65) Prior Publication Data

US 2022/0298279 A1 Sep. 22, 2022

(30) Foreign Application Priority Data

Mar. 16, 2021 (KR) ........................ 10-2021-0034284

(51) Int. Cl.
*C08F 222/10* (2006.01)
*C08F 2/50* (2006.01)
(Continued)

(52) U.S. Cl.
CPC ............ *C08F 222/102* (2020.02); *C08F 2/50* (2013.01); *C09D 4/00* (2013.01); *C09D 133/062* (2013.01);
(Continued)

(58) Field of Classification Search
CPC ...... C08F 222/102; C08F 2/48; C08F 222/10; C08F 2/44; C08F 2/50; C08F 220/30;
(Continued)

(56) References Cited

U.S. PATENT DOCUMENTS 9,123,647 B2 9/2015 Kim et al.
9,790,402 B2 10/2017 Ogawa et al.
(Continued)

FOREIGN PATENT DOCUMENTS

CN 106687488 A 5/2017
GB 1413383 A * 11/1975 .............. C08F 20/20
(Continued)

OTHER PUBLICATIONS

Korean Patent Abstract No. 10-1518104 B1 for Korean Patent Publication No. 10-2012-0139614 A, Dec. 27, 2012, 1 page.
(Continued)

*Primary Examiner* — John D Freeman
(74) *Attorney, Agent, or Firm* — Womble Bond Dickinson (US) LLP

(57) ABSTRACT

A resin composition of an embodiment includes a (meth) acrylate monomer, a photoinitiator, and a moisture absorbent, wherein the moisture absorbent includes a hydrolysable group, and a carboxyl group after hydrolysis, thereby providing a display device with improved tolerance to moisture and moisture permeability.

17 Claims, 7 Drawing Sheets

(51) Int. Cl.

| | |
|---|---|
| ***C09D 4/00*** | (2006.01) |
| ***C09D 133/06*** | (2006.01) |
| ***H10K 59/80*** | (2023.01) |
| *H10K 50/115* | (2023.01) |
| *H10K 59/38* | (2023.01) |

(52) U.S. Cl.
CPC ............ *H10K 50/115* (2023.02); *H10K 59/38* (2023.02); *H10K 59/873* (2023.02); *H10K 59/874* (2023.02)

(58) Field of Classification Search
CPC .... H10K 59/873; H10K 59/874; H10K 59/38; H10K 2102/331; H10K 50/115; H10K 59/8731; C09D 4/00; C09D 133/062; G09F 9/30
See application file for complete search history.

(56) References Cited

U.S. PATENT DOCUMENTS

| | | | | |
|---|---|---|---|---|
| 10,556,974 | B2 | 2/2020 | Mieda et al. | |
| 11,925,045 | B2 | 3/2024 | Kim et al. | |
| 2005/0285513 | A1 | 12/2005 | Choi et al. | |
| 2009/0143505 | A1* | 6/2009 | Samukawa | C09D 133/08 524/89 |
| 2010/0165263 | A1* | 7/2010 | Lee | C08J 5/18 526/172 |
| 2017/0022313 | A1* | 1/2017 | Hood | C08F 220/283 |
| 2018/0090714 | A1* | 3/2018 | Kim | H10K 85/141 |
| 2019/0048119 | A1 | 2/2019 | Yu et al. | |
| 2020/0041709 | A1* | 2/2020 | Lee | G02B 6/005 |

FOREIGN PATENT DOCUMENTS

| | | | | | |
|---|---|---|---|---|---|
| IN | 201817039298 | A | | 1/2019 | |
| JP | 2004002616 | A | * | 1/2004 | |
| KR | 10-0615228 | B1 | | 8/2006 | |
| KR | 10-2012-0005936 | A | | 1/2012 | |
| KR | 10-2012-0139614 | A | | 12/2012 | |
| KR | 10-2014-0142232 | A | | 12/2014 | |
| KR | 10-2016-0150255 | A | | 12/2016 | |
| KR | 10-2017-0132225 | A | | 12/2017 | |
| KR | 2020014450 | A | * | 2/2020 | G02B 1/11 |
| KR | 10-2020-0040166 | A | | 4/2020 | |
| KR | 10-2020-0054900 | A | | 5/2020 | |
| KR | 10-2021-0008270 | A | | 1/2021 | |

OTHER PUBLICATIONS

Chinese Notification of First Office Action, for Patent Application No. 202210157522.7, dated Feb. 25, 2026, 6 pages.

* cited by examiner

RESIN COMPOSITION AND DISPLAY DEVICE USING THE SAME

CROSS-REFERENCE TO RELATED APPLICATIONS

This application claims priority to and the benefit of Korean Patent Application No. 10-2021-0034284, filed on Mar. 16, 2021, the entire content of which is hereby incorporated by reference.

BACKGROUND

The present disclosure herein relates to a resin composition, and a display device utilizing the same.

Various kinds (e.g., types) of display devices are utilized for providing image information, and development on self-luminous display devices utilizing an organic electroluminescent material and/or a quantum dot luminous material is being conducted.

The self-luminous display device includes a light-emitting element, and the light-emitting element has features (e.g., components) vulnerable to external environments such as oxygen and/or moisture, and various techniques for encapsulating the light-emitting element are utilized (e.g., required). Among them, development on an encapsulation layer for blocking the penetration route of oxygen, moisture, etc., by positioning the encapsulation layer on the light-emitting element is being conducted.

SUMMARY

Aspects according to embodiments of the present disclosure are directed toward a resin composition having suitable or excellent tolerance to moisture permeability and an encapsulation member prepared therefrom.

Aspects according to embodiments of the present disclosure are directed toward a display device having improved reliability by including an encapsulation member having suitable or excellent tolerance to moisture permeability.

A resin composition according to an embodiment of the present disclosure includes a (meth)acrylate monomer, a photoinitiator, and a moisture absorbent, wherein the moisture absorbent includes a hydrolysable group, and a carboxylic group after hydrolysis.

In an embodiment, the (meth)acrylate monomer may include a first (meth)acrylate monomer which is bifunctional, and a second (meth)acrylate monomer different from the first (meth)acrylate monomer and includes a substituted or unsubstituted aryl group having 6 to 30 ring-forming carbon atoms.

In an embodiment, the hydrolysable group may include at least one selected among an acid anhydride, an imide group, an ester group, and an amide group.

In an embodiment, about 30 to about 70 parts by weight of the first (meth)acrylate monomer, about 20 to about 50 parts by weight of the second (meth)acrylate monomer, about 1 to about 5 parts by weight of the photoinitiator, and about 1 to about 50 parts by weight of the moisture absorbent may be included, each based on a total weight of the resin composition.

In an embodiment, the hydrolysable group may be an acid anhydride represented by Formula 1 below.

Formula 1

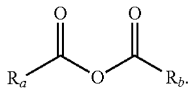

In Formula 1, $R_a$ and $R_b$ are each independently a substituted or unsubstituted alkyl group having 1 to 20 carbon atoms, a substituted or unsubstituted alkenyl group having 2 to 20 carbon atoms, a substituted or unsubstituted aryl group having 6 to 30 ring-forming carbon atoms, a substituted or unsubstituted heteroaryl group having 2 to 30 ring-forming carbon atoms, or a substituted or unsubstituted (meth)acrylate group, and $R_a$ and $R_b$ may be optionally combined with each other to form a ring.

In an embodiment, the moisture absorbent may include a polymerization reaction group configured to react with the first (meth)acrylate monomer and the second (meth)acrylate monomer.

In an embodiment, the first (meth)acrylate monomer may be represented by Formula 2 below.

Formula 2

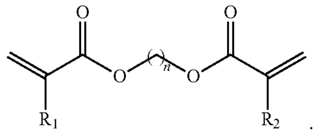

In Formula 2, $R_1$ and $R_2$ are each independently a hydrogen atom, or a substituted or unsubstituted methyl group, and "n" is an integer of 6 to 12.

In an embodiment, the second (meth)acrylate monomer may be represented by Formula 3 below.

Formula 3

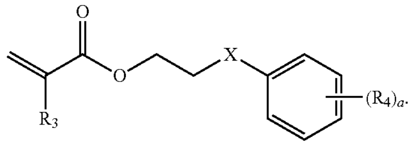

In Formula 3, $R_3$ is a hydrogen atom, or a substituted or unsubstituted methyl group, $R_4$ is a hydrogen atom, a deuterium atom, a halogen atom, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms, X is a direct linkage or O, and "a" is an integer of 0 to 5.

In an embodiment of the present disclosure, a display device includes a light-emitting element layer, an encapsulation layer on the light-emitting element layer and including one or more organic layers, a filling layer on the encapsulation layer, and a light control layer on the filling layer, wherein at least one selected among the one or more organic layers and the filling layer includes a copolymer of a monomer mixture including a (meth)acrylate monomer and a moisture absorbent, and the moisture absorbent includes a compound containing a hydrolysable group and/or a compound containing a carboxylic group.

In an embodiment, the (meth)acrylate monomer may include a first (meth)acrylate monomer which is bifunctional, and a second (meth)acrylate monomer different from the first (meth)acrylate monomer and includes a substituted or unsubstituted aryl group having 6 to 30 ring-forming carbon atoms.

In an embodiment, the hydrolysable group may include at least one selected among an acid anhydride, an imide group, an ester group, and an amide group.

In an embodiment, the hydrolysable group may be an acid anhydride represented by Formula 1 below.

Formula 1

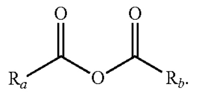

In Formula 1, $R_a$ and $R_b$ are each independently a substituted or unsubstituted alkyl group having 1 to 20 carbon atoms, a substituted or unsubstituted alkenyl group having 2 to 20 carbon atoms, a substituted or unsubstituted aryl group having 6 to 30 ring-forming carbon atoms, a substituted or unsubstituted heteroaryl group having 2 to 30 ring-forming carbon atoms, or a substituted or unsubstituted (meth)acrylate group, and $R_a$ and $R_b$ may be optionally combined with each other to form a ring.

In an embodiment, the encapsulation layer may further include one or more inorganic layers, and the one or more organic layers and the one or more inorganic layers may be alternately stacked.

In an embodiment, the one or more inorganic layers may include at least one selected among $SiN_x$, $SiO_x$, $SiO_xN_y$, SiC, $ZrO_x$, and $Al_2O_3$, and may be formed by plasma chemical vapor deposition and/or sputtering.

In an embodiment, a thickness of each of the one or more organic layers may be from about 3 μm to about 30 μm, and a thickness of each of the one or more inorganic layers may be from about 0.5 μm to about 2 μm.

In an embodiment, the encapsulation layer may be to encapsulate the light-emitting element layer.

In an embodiment, the first (meth)acrylate monomer may be represented by Formula 2 below, and the second (meth) acrylate monomer may be represented by Formula 3 below.

Formula 2

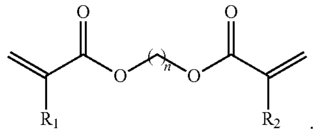

In Formula 2, $R_1$ and $R_2$ are each independently a hydrogen atom, or a substituted or unsubstituted methyl group, and "n" is an integer of 6 to 12.

Formula 3

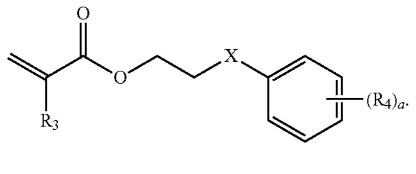

In Formula 3, $R_3$ is a hydrogen atom, or a substituted or unsubstituted methyl group, $R_4$ is a hydrogen atom, a deuterium atom, a halogen atom, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms, X is a direct linkage or O, and "a" is an integer of 0 to 5.

In an embodiment, the light control layer may include a quantum dot.

In an embodiment, the light-emitting element layer may include a light-emitting element to generate a first light, and the light control layer may include a transmissive part to transmit the first light, a first light control part to convert the first light into a second light, and a second light control part to convert the first light into a third light.

In an embodiment, a color filter layer on the light control layer may be further included, wherein the color filter layer may include a first color filter overlapped with the transmissive part and to transmit the first light, a second color filter overlapped with the first light control part, and to block the first light and to transmit the second light, and a third color filter overlapped with the second light control part, and to block the first light and to transmit the third light.

BRIEF DESCRIPTION OF THE FIGURES

The accompanying drawings are included to provide a further understanding of the present disclosure, and are incorporated in and constitute a part of this specification. The drawings illustrate example embodiments of the present disclosure and, together with the description, serve to explain principles of the present disclosure. In the drawings.

DETAILED DESCRIPTION

Figure 1:
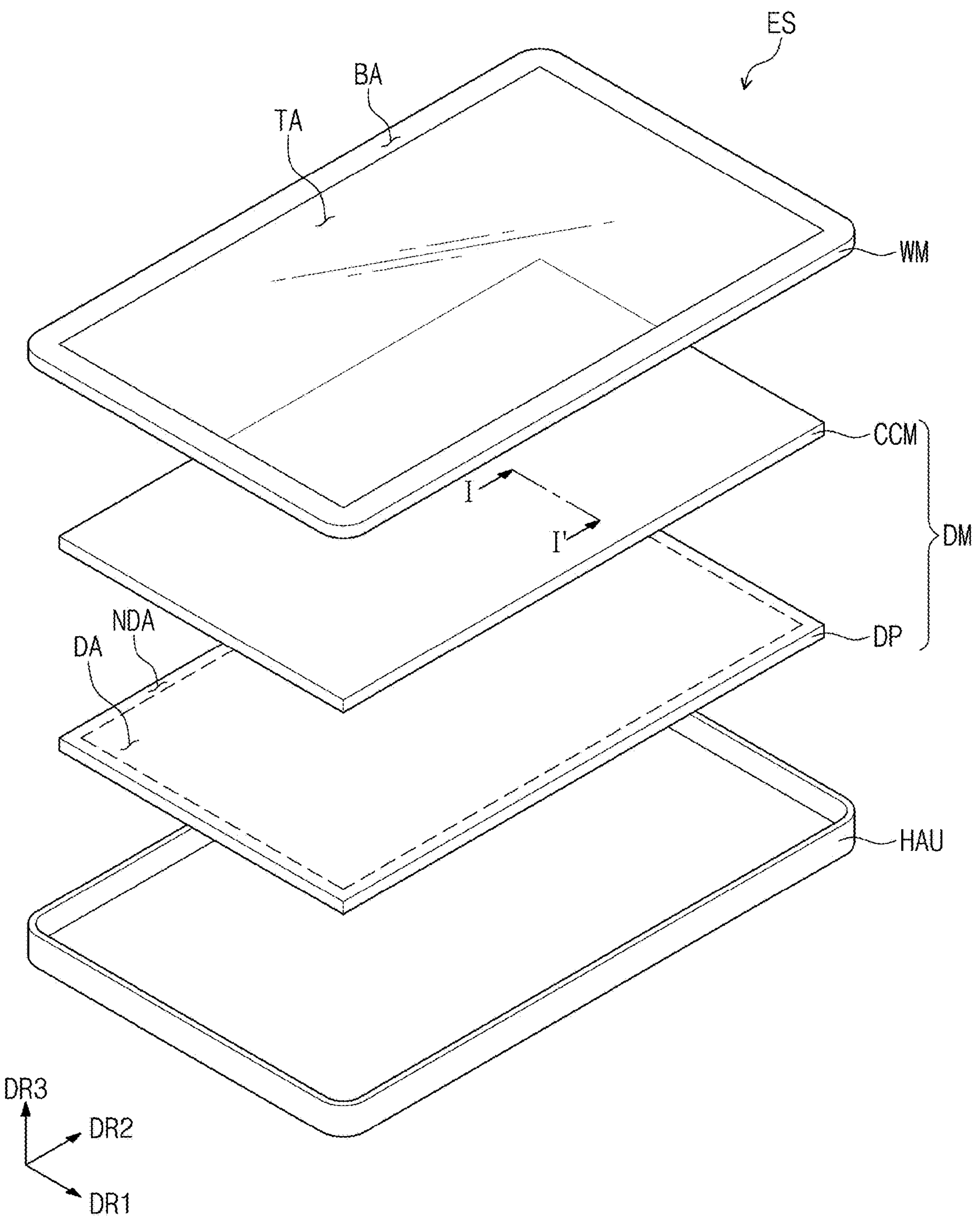
FIG. 1 is an exploded perspective view of a display device according to an embodiment of the present disclosure.

The present disclosure may have various modifications and may be embodied in different forms, and example embodiments will be explained in more detail with reference to the accompany drawings. The present disclosure may, however, be embodied in different forms and should not be construed as limited to the embodiments set forth herein. Rather, all modifications, equivalents, and substituents which are included in the spirit and technical scope of the present disclosure should be included in the present disclosure.

It will be understood that when an element (or region, layer, part, etc.) is referred to as being "on", "connected to" or "coupled to" another element, it can be directly on, connected or coupled to the other element or intervening elements may be present.

Meanwhile, the term "directly disposed," "directly on," "directly connected to," or "directly coupled to" in the present disclosure may refer to that no additional layer, film, region, plate, etc. is present between a part such as a layer, a film, a region, a plate, etc. and another part. For example, when an element is referred to as being "directly on," or "directly disposed" (on another element), the two elements (e.g., two layers or two units) are disposed without having an additional element (such as an adhesive unit) therebetween.

Like reference numerals refer to like elements throughout. In addition, in the drawings, the thickness, the ratio, and the dimensions of constituent elements may be exaggerated for effective explanation of technical contents.

The term "and/or" includes any and all combinations of one or more of the associated listed items.

It will be understood that, although the terms "first," "second," etc. may be used herein to describe various elements, these elements should not be limited by these terms. These terms are only used to distinguish one element from another element. Thus, a first element could be termed a second element without departing from the teachings of the present disclosure. Similarly, a second element could be termed a first element. As used herein, the singular forms are intended to include the plural forms as well, unless the context clearly indicates otherwise.

In addition, the terms "below", "beneath", "on" and "above" are used for explaining the relationships of elements shown in the drawings. The terms are relative concept and are explained based on the direction shown in the drawing.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

It will be further understood that the terms "include," "have," "comprises," or "comprising," when used in this specification, specify the presence of stated features, numerals, steps, operations, elements, parts, or the combination thereof, but do not preclude the presence or addition of one or more other features, numerals, steps, operations, elements, parts, or the combination thereof.

Hereinafter, a resin composition according to an embodiment of the present disclosure, and a display device according to an embodiment will be explained with reference to the accompanying drawings.

Figure 2:
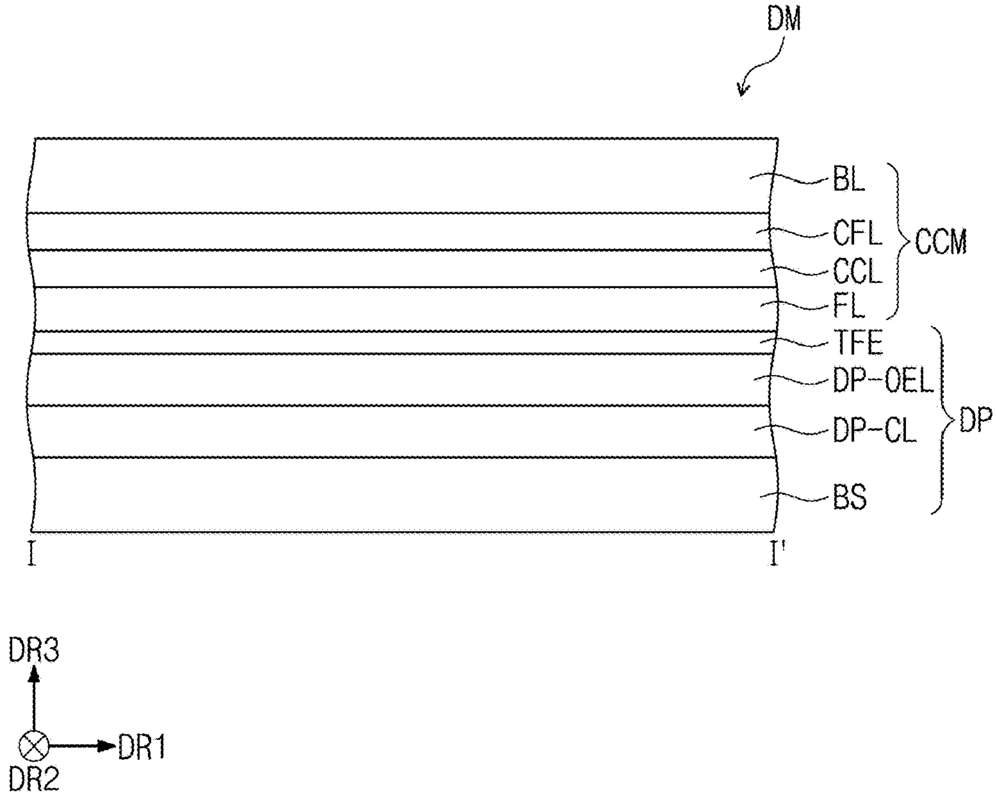
FIG. 2 is a cross-sectional view of a display module according to an embodiment of the present disclosure.

FIG. 1 is an exploded perspective view of a display device according to an embodiment of the present disclosure. FIG. 2 is a cross-sectional view of a display module according to an embodiment of the present disclosure. FIG. 2 shows a cross-sectional view corresponding to the line I-I' in FIG. 1.

In an embodiment, a display device ES may be a large-sized display device such as a television, a monitor and/or an external advertising board. In addition, the display device ES may be a display device utilized in a small and/or medium-sized product such as a personal computer, a notebook computer, a personal digital terminal, a car navigation unit, a game console, a smartphone, a tablet and/or a camera. In addition, these devices are disclosed only for illustration, and other display devices may be employed in other electronic devices unless these devices deviate from the present disclosure.

The display device ES of an embodiment may include a window WM, a display module DM and a housing HAU. The display module DM may include a display panel DP which is a display element. In some embodiments, the display device ES may include various elements activated by electronic signals, including a touch element and/or a detection element in addition to the display element.

In the description, for the convenience of explanation, a third direction DR3 is defined as a direction providing users with images. In addition, a first direction DR1 and a second direction DR2 cross (e.g., are orthogonal to) each other, and the third direction DR3 may be a normal line direction with respect to a plane defined by the first direction DR1 and the second direction DR2. In FIG. 1, the plane defined by the first direction DR1 and the second direction DR2 may be a display surface providing images. Meanwhile, the thickness direction of the display device ES is indicated by the third direction DR3. The front surface (or top surface) and rear surface (or bottom surface) of each member may be defined (e.g., divided) in the third direction DR3. However, the directions indicated by the first to third directions DR1, DR2 and DR3 are relative concepts and may be changed into other directions. Hereinafter, the first to third directions are directions indicted by the first to third directions DR1, DR2 and DR3, respectively and refer to the same reference symbols.

In the display device ES of an embodiment, the window WM may be disposed on the display module DM. The window WM may have a material including glass, sapphire, and/or plastic. The window WM includes a transmission area TA transmitting images provided from the display module DM, and a shading area BA which is adjacent to the transmission area TA and does not transmit images. In some embodiments, different from the illustration in FIG. 1, in the display device ES, the window WM may be omitted.

In the display device ES of an embodiment, the display module DM may be disposed under the window WM. The display module DM may include a display panel DP and a light control part (e.g., light control unit) CCM disposed on the display panel DP.

The display panel DP may be a light-emitting (e.g., light-emitting type) display panel. For example, the display panel DP may be a light-emitting diode (LED) display panel, an organic electroluminescence display panel, or a quantum dot light-emitting display panel. However, the present disclosure is not limited thereto.

The light-emitting diode (LED) display panel may include light-emitting diodes, the emission layer of the organic electroluminescence display panel may include an organic electroluminescent material, and the quantum dot light-emitting display panel may include a quantum dot, a quantum rod, and/or the like. Hereinafter, the display panel DP included in the display device ES of an embodiment in the description will be explained referring to the organic electroluminescence display panel. However, the present disclosure is not limited thereto.

The display device ES of an embodiment includes a display panel DP and a light control member CCM disposed on the display panel DP, and the display device ES of an embodiment may be an organic electroluminescence display device including an organic electroluminescence display panel. The display panel DP may provide a first light. For example, the display panel DP may emit blue light.

The light control member CCM may convert the wavelength of light provided from the display panel DP or transmit light provided from the display panel DP. The light control member CCM may convert the wavelength of blue light or transmit blue light provided from the display panel DP.

On a plane (e.g., in a plan view), one side of the display panel DP that displays images is defined as a displaying surface. The displaying surface includes a display area DA that displays images and a non-display area NDA that does not display images. The display area DA is defined in the middle of the display panel DP on a plane (e.g., in a plan view) and may overlap with the transmission area TA of the window WM.

The housing HAU may be disposed under the display panel DP and receive the display panel DP. The housing HAU may be disposed to cover (e.g., a portion of) the display panel DP and to expose a top surface which is the display surface of the display panel DP. For example, the housing HAU may cover the side surface and bottom surface of the display panel and expose the whole top surface.

Referring to FIG. 2, the display panel DP may include a base substrate BS, a circuit layer DP-CL provided on the base substrate BS, a light-emitting element layer DP-OEL and an encapsulation layer TFE. In an embodiment, the base substrate BS, the circuit layer DP-CL, the light-emitting element layer DP-OEL and the encapsulation layer TFE may be stacked in the stated order in the third direction DR3.

The base substrate BS may be a member providing a base surface where the light-emitting element layer DP-OEL is disposed. The base substrate BS may be a glass substrate, a metal substrate, a plastic substrate, etc. However, the present disclosure is not limited thereto, and the base substrate BS may be an inorganic layer, an organic layer, or a composite (e.g., organic-inorganic composite) material layer.

In an embodiment, the circuit layer DP-CL is disposed on the base substrate BS, and the circuit layer DP-CL may include multiple transistors. Each of the transistors may include a control electrode, an input electrode, and an output electrode. For example, the circuit layer DP-CL may include switching transistors and driving transistors for driving an organic electroluminescence element OEL (FIG. 7) of the light-emitting element layer DP-OEL.

The encapsulation layer TFE is disposed on the light-emitting element layer DP-OEL and may include multiple thin films. The encapsulation layer TFE will be explained in more detail later.

The light control member CCM is disposed on the display panel DP. The light control member CCM may include a filling layer FL, a light control layer CCL, a color filter layer CFL, and a base layer BL. In some embodiments, the base layer BL may be omitted. In some embodiments, the display panel DP may include an organic electroluminescence element OEL (FIG. 7) emitting a first light, and the light control member CCM may include a light control layer CCL, which converts the wavelength of the first light provided from the organic electroluminescence element OEL (FIG. 7) or transmits the first light.

The filling layer FL may be disposed between the encapsulation layer TFE and the light control layer CCL. The filling layer FL may be disposed between the encapsulation layer TFE and the light control layer CCL to avoid or prevent the contact of the light control layer CCL with the encapsulation layer TFE, and may also (e.g., possibly) improve the light extraction efficiency of the display module DM.

The filling layer FL may fill up a space between the encapsulation layer TFE and the light control layer CCL. For example, the space between the encapsulation layer TFE and the light control layer CCL may be filled up with the filling layer FL so that an inner space between the encapsulation layer TFE and the light control layer CCL may not be formed, and the filling layer FL may be in contact with both the encapsulation layer TFE and the light control layer CCL.

The filling layer FL may be directly disposed on an inorganic layer disposed at the outermost (e.g., as the outermost layer) of the encapsulation layer TFE. In an embodiment, the filling layer FL may include a moisture absorbent which will be explained later. In some embodiments, the filling layer FL may include a copolymer including a (meth)acrylate monomer and a moisture absorbent of an embodiment. In the case where the filling layer FL includes a moisture absorbent of an embodiment, the oxidation of a luminous body and/or scattering particles included in the light control layer CCL by moisture and/or air may be reduced or blocked, and accordingly, the light extraction efficiency of the display module DM may be maintained without much change (e.g., over time). The moisture absorbent will be explained in more detail later.

The filling layer FL may include an organic binder, an organic/inorganic binder, or a liquid crystal compound in addition to a (meth)acrylate monomer, without specific limitation. In this case, the filling layer FL may include a moisture absorbent which is connected with the binder material via a covalent bond. For example, the moisture absorbent may form a copolymer with the binder material, or may be present in the main chain of a polymer or copolymer including the binder material via a crosslinking bond. However, the present disclosure is not limited thereto. In some embodiments, the filling layer FL may further include a curing agent, a crosslinking agent, a ultraviolet stabilizer, and/or the like.

Figure 3:
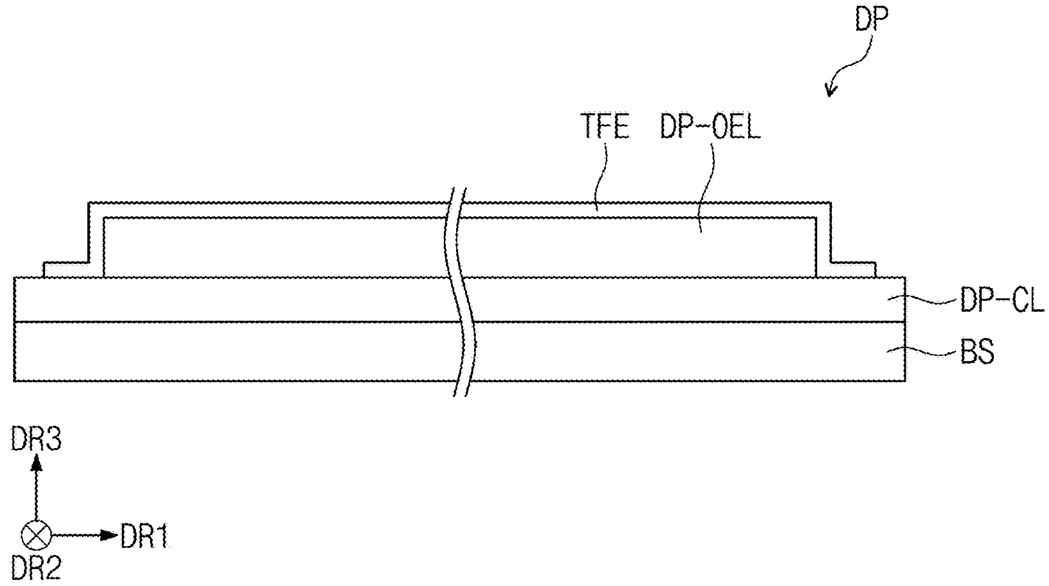
FIG. 3 is a cross-sectional view of a display panel according to an embodiment of the present disclosure.
Figure 4:
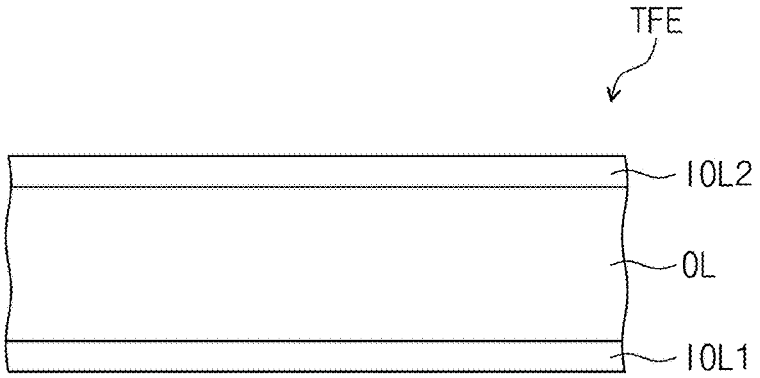
FIG. 4 is a cross-sectional view showing a part of an encapsulation layer according to an embodiment of the present disclosure.
Figure 5:
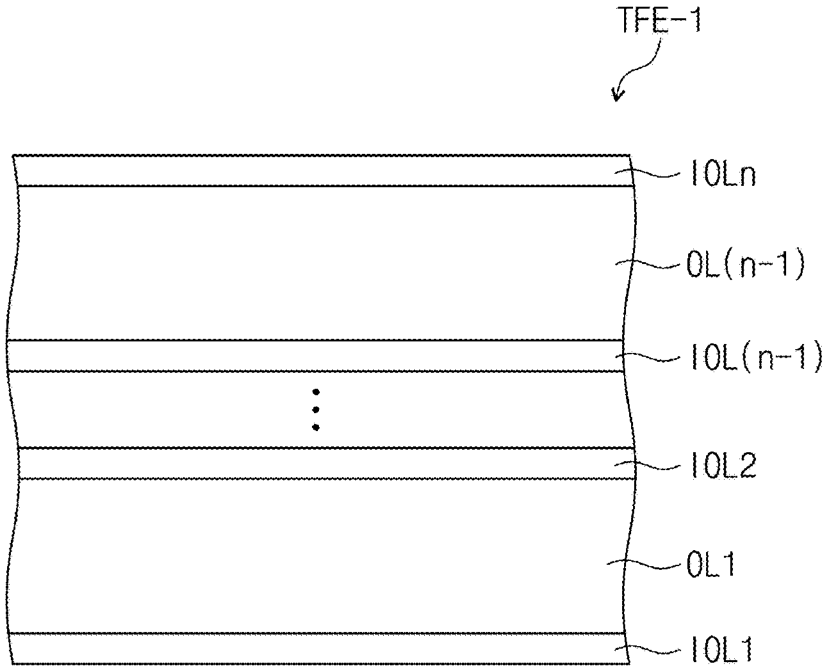
FIG. 5 is a cross-sectional view showing an encapsulation layer according to an embodiment of the present disclosure.

Hereinafter, the encapsulation layer TFE will be explained in more detail through FIG. 3 to FIG. 5. FIG. 3 is a cross-sectional view showing a display panel included in a display device of an embodiment. FIG. 4 and FIG. 5 are cross-sectional views of encapsulation layers according to embodiments.

Referring to FIG. 3, the display panel of an embodiment may include a light-emitting element layer DP-OEL and an encapsulation layer TFE disposed on the light-emitting element layer DP-OEL. The encapsulation layer TFE may cover the light-emitting element layer DP-OEL. The encapsulation layer TFE may be disposed to cover (e.g., wrap) the light-emitting element layer DP-OEL to encapsulate the light-emitting element layer DP-OEL.

Referring to FIG. 4 and FIG. 5, the encapsulation layer TFE may include one or more organic layers OL and one or more inorganic layers IOL1 and IOL2, and the one or more inorganic layers IOL1 and IOL2, and the one or more organic layers OL may be alternately disposed. For example, the encapsulation layer TFE may include two inorganic layers IOL1 and IOL2 and an organic layer OL disposed between the inorganic layers IOL1 and IOL2. The organic layer OL may be formed from a resin composition which will be explained in more detail later.

In an embodiment, the inorganic layers IOL1 and IOL2 may include at least one selected among silicon nitride ($SiN_x$), silicon oxide ($SiO_x$), silicon oxynitride ($SiO_xN_y$), silicon carbide (SiC), zirconium oxide ($ZrO_x$), and aluminum oxide ($Al_2O_3$). Here, x and y are each independently greater than 0 and less than 4, but x and y are not limited to integers.

The inorganic layers IOL1 and IOL2 may be formed utilizing sputtering, chemical vapor deposition (CVD), plasma enhanced chemical vapor deposition (PECVD), and/or atomic layer deposition, but the present disclosure is not limited thereto.

In an embodiment, the inorganic layers IOL1 and IOL2 may be formed through plasma enhanced chemical vapor deposition (PECVD) and/or a sputtering process. In this case, the entire thickness of a layer may become uniform and thin (e.g., the entire layer may be thin with uniform thickness), and the density of the thin layer may increase and accordingly, the introduction of particles into the inorganic layers IOL1 and IOL2 during deposition may be prevented or substantially prevented. In addition, a low-temperature deposition method may be utilized (e.g., may be possible), and the thermal damage of organic materials during a deposition process may be reduced or prevented.

The organic layer OL may be formed by a process such as flash evaporation, spin coating, dip coating, and/or inkjet printing, but the present disclosure is not limited thereto. In an embodiment, the organic layer OL may be formed by applying a resin composition on an inorganic layer through a flash evaporation and/or inkjet printing process, and followed by curing. In an embodiment, the organic layer OL may be formed by polymerization through the photocuring of a resin composition provided. For example, the resin composition provided may be polymerized utilizing a method such as ultraviolet curing, infrared curing, and/or laser curing, but an embodiment of the present disclosure is not limited thereto.

An encapsulation layer TFE-1 according to an embodiment, shown in FIG. 5, may include n inorganic layers IOL1 to IOLn including a first inorganic layer IOL1, disposed on a light-emitting element layer DP-OEL (FIG. 3). In addition, the first inorganic layer IOL1 may be disposed to be in direct contact with the light-emitting element layer DP-OEL (FIG. 3). The first inorganic layer IOL1 is defined as a bottom inorganic layer, and the remaining inorganic layers among the n inorganic layers IOL1 to IOLn except for the first inorganic layer IOL1, may be defined as upper inorganic layers. The encapsulation layer TFE-1 may include n−1 organic layers OL1 to OL(n−1), and the n−1 organic layers OL1 to OL(n−1) may be alternately disposed with the n inorganic layers IOL1 to IOLn. On average, the n−1 organic layers OL1 to OL(n−1) may have greater thicknesses than the n inorganic layers IOL1 to IOLn. Each of the n inorganic layers IOL1 to IOLn may have a single layer including one material or multiple layers each including different material(s).

At least one selected among the n−1 organic layers OL1 to OL(n−1) may be formed from a resin composition of an embodiment, which will be explained in more detail later. That is, at least one of the organic layers OL1 to OL(n−1) may include a copolymer derived from the resin composition of an embodiment. For example, at least one of the organic layers OL1 to OL(n−1) may include a copolymer including a (meth)acrylate monomer and a moisture absorbent.

The inorganic layer may have defects such as cracks and/or pinholes due to an incomplete bonding structure at the surface or inside thereof during a deposition process. In this case, the defects may act as a penetration route of oxygen and/or moisture and may induce the deterioration of a light-emitting element, or act as an electron transfer route, leading to the increase of a leakage current. For example, due to moisture penetrated into a light-emitting element, a dark spot, which is a non-luminous spot, may be formed, and due to this, light efficiency may be deteriorated. In the description, in at least one selected among an organic layer and a filling layer, which may be adjacently disposed to an inorganic layer, a molecule having moisture absorbing properties may be included to improve tolerance to moisture and moisture permeability, and as a result, the reliability of a display device may be improved.

A resin composition according to an embodiment of the present disclosure may be utilized for forming an encapsulation layer and/or a filling layer, included in a display device. The resin composition according to an embodiment of the present disclosure may be utilized for forming an organic layer and/or a filling layer, disposed on the inorganic layer of an encapsulation layer for a display device. More particularly, the resin composition according to an embodiment of the present disclosure may be applied on one side of the inorganic layer of the encapsulation layer and cured by ultraviolet rays, thereby forming an organic layer and/or a filling layer, with (e.g., supplemented with) moisture absorbing properties.

The resin composition according to an embodiment includes a (meth)acrylate monomer, a photoinitiator and a moisture absorbent. In addition, the resin composition according to an embodiment may include a first (meth) acrylate monomer, a second (meth)acrylate monomer which is different from the first (meth)acrylate monomer, a photoinitiator and a moisture absorbent.

In the description, the term "substituted or unsubstituted" corresponds to a functional group or moiety being substituted or unsubstituted with one or more substituents selected from the group consisting of a deuterium atom, a halogen atom, a cyano group, a nitro group, an amino group, a silyl group, an oxy group, a thio group, a sulfinyl group, a sulfonyl group, a carbonyl group, a boron group, a phosphine oxide group, a phosphine sulfide group, an alkyl group, an alkenyl group, an alkynyl group, an alkoxy group, a hydrocarbon ring group, an aryl group, and a heterocyclic group. In addition, each of the exemplified substituents may be substituted or unsubstituted. For example, a biphenyl group may be interpreted as an aryl group or a phenyl group substituted with a phenyl group.

In the description, the halogen atom may be a fluorine atom, a chlorine atom, a bromine atom and/or an iodine atom.

In the description, the alkyl group may be a linear, branched or cyclic alkyl group. The carbon number of the alkyl group may be 1 to 50, 1 to 30, 1 to 20, 1 to 10, or 1 to 6. Examples of the alkyl group may include a methyl group, an ethyl group, an n-propyl group, an isopropyl group, an n-butyl group, an s-butyl group, a t-butyl group, an i-butyl group, a 2-ethylbutyl group, a 3,3-dimethylbutyl group, an n-pentyl group, an i-pentyl group, a neopentyl group, a t-pentyl group, a cyclopentyl group, a 1-methylpentyl group, a 3-methylpentyl group, a 2-ethylpentyl group, a 4-methyl-2-pentyl group, an n-hexyl group, a 1-methylhexyl group, a 2-ethylhexyl group, a 2-butylhexyl group, a cyclohexyl group, a 4-methylcyclohexyl group, a 4-t-butylcyclohexyl group, an n-heptyl group, a 1-methylheptyl group, a 2,2-dimethylheptyl group, a 2-ethylheptyl group, a 2-butylheptyl group, an n-octyl group, a t-octyl group, a 2-ethyloctyl group, a 2-butyloctyl group, a 2-hexyloctyl group, a 3,7-dimethyloctyl group, a cyclooctyl group, an n-nonyl group, an n-decyl group, an adamantyl group, a 2-ethyldecyl group, a 2-butyldecyl group, a 2-hexyldecyl group, a 2-octyldecyl group, an n-undecyl group, an n-dodecyl group, a 2-ethyldodecyl group, a 2-butyldodecyl group, a 2-hexyldocecyl group, a 2-octyldodecyl group, an n-tridecyl group, an n-tetradecyl group, an n-pentadecyl group, an n-hexadecyl group, a 2-ethylhexadecyl group, a 2-butylhexadecyl group, a 2-hexylhexadecyl group, a 2-octylhexadecyl group, an n-heptadecyl group, an n-octadecyl group, an n-nonadecyl group, an n-eicosyl group, a 2-ethyleicosyl group, a 2-butyleicosyl group, a 2-hexyleicosyl group, a 2-octyleicosyl group, an n-henicosyl group, an n-docosyl group, an n-tricosyl group, an n-tetracosyl group, an n-pentacosyl group, an n-hexacosyl group, an n-heptacosyl group, an n-octacosyl group, an n-nonacosyl group, an n-triacontyl, etc., without being limited thereto.

In the description, the term "hydrocarbon ring group" refers to an optional functional group or substituent derived from an aliphatic hydrocarbon ring. The hydrocarbon ring group may be a saturated hydrocarbon ring group having 5 to 20 ring-forming carbon atoms.

In the description, the term "aryl group" refers to an optional functional group or substituent derived from an aromatic hydrocarbon ring. The aryl group may be a monocyclic aryl group or a polycyclic aryl group. The carbon number for forming rings in the aryl group may be 6 to 30, 6 to 20, or 6 to 15. Examples of the aryl group may include a phenyl group, a naphthyl group, a fluorenyl group, a anthracenyl group, a phenanthryl group, a biphenyl group, a terphenyl group, a quaterphenyl group, a quinqphenyl group, a sexiphenyl group, a triphenylenyl group, a pyrenyl group, a benzofluoranthenyl group, a chrysenyl group, etc., without being limited thereto.

In the description, the term "heterocyclic group" refers to an optional functional group or substituent derived from a ring including one or more selected among B, O, N, P, Si and S as heteroatoms. The heterocyclic group includes an aliphatic heterocyclic group and an aromatic heterocyclic group. The aromatic heterocyclic group may be a heteroaryl group. The aliphatic heterocyclic group and the aromatic heterocyclic group may be a monocycle or a polycycle.

In the description, the heterocyclic group may include one or more selected among B, O, N, P, Si and S as heteroatoms. When the heterocyclic group includes two or more heteroatoms, the two or more heteroatoms may be the same or different. The heterocyclic group may be a monocyclic heterocyclic group or a polycyclic heterocyclic group, and includes a heteroaryl group. The carbon number for forming rings of the heteroaryl group may be 2 to 30, 2 to 20, and 2 to 10.

In the description, the aliphatic heterocyclic group may include one or more selected among B, O, N, P, Si and S as heteroatoms. The number of ring-forming carbon atoms of the aliphatic heterocyclic group may be 2 to 30, 2 to 20, or 2 to 10. Examples of the aliphatic heterocyclic group may include an oxirane group, a thiirane group, a pyrrolidine group, a piperidine group, a tetrahydrofuran group, a tetrahydrothiophene group, a thiane group, a tetrahydropyran group, a 1,4-dioxane group, etc., without being limited thereto.

In the description, the heteroaryl group may include one or more selected among B, O, N, P, Si and S as heteroatoms. When the heteroaryl group includes two or more heteroatoms, the two or more heteroatoms may be the same or different. The heteroaryl group may be a monocyclic heterocyclic group or a polycyclic heterocyclic group. The carbon number for forming rings of the heteroaryl group may be 2 to 30, 2 to 20, or 2 to 10. Examples of the heteroaryl group may include a thiophene group, a furan group, a pyrrole group, an imidazole group, a triazole group, a pyridine group, a bipyridine group, a pyrimidine group, a triazine group, a triazole group, an acridyl group, a pyridazine group, a pyrazinyl group, a quinoline group, a quinazoline group, a quinoxaline group, a phenoxazine group, a phthalazine group, a pyrido pyrimidine group, a pyrido pyrazine group, a pyrazino pyrazine group, an isoquinoline group, an indole group, a carbazole group, an N-arylcarbazole group, an N-heteroarylcarbazole group, an N-alkylcarbazole group, a benzoxazole group, a benzoimidazole group, a benzothiazole group, a benzocarbazole group, a benzothiophene group, a dibenzothiophene group, a thienothiophene group, a benzofuran group, a phenanthroline group, a thiazole group, an isooxazole group, an oxazole group, an oxadiazole group, a thiadiazole group, a phenothiazine group, a dibenzosilole group, a dibenzofuran group, etc., without being limited thereto.

In the description, the carbon number of a carbonyl group is not specifically limited, but the carbon number may be 1 to 40, 1 to 30, or 1 to 20. For example, the carbonyl group may have the structures below, but is not limited thereto.

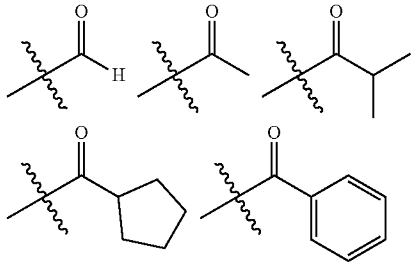

In the description, the term "oxy group" may refer to the above-defined alkyl group or aryl group which is combined with an oxygen atom. The oxy group may include an alkoxy group and an aryl oxy group. The alkoxy group may be a linear, branched or cyclic chain. The carbon number of the alkoxy group is not specifically limited but may be, for example, 1 to 20 or 1 to 10. Examples of the oxy group may include a methoxy group, an ethoxy group, an n-propoxy group, an isopropoxy group, a butoxy group, a pentyloxy group, a hexyloxy group, an octyloxy group, a nonyloxy group, a decyloxy group, a benzyloxy group, etc. However, an embodiment of the present disclosure is not limited thereto.

In the description, the carbon number of an ester group is not specifically limited but may be 1 to 40, 1 to 30, or 1 to 20. Examples of the ester group in the description may include alkyl esters including a methyl acetate group, an ethyl acetate group, a propyl acetate group, a butyl acetate group, an ethyl 2-hydroxypropionate group, a methyl 2-hydroxy-2-methylpropionate group, an ethyl 2-hydroxy-2-methylpropionate group, a methyl hydroxyacetate group, an ethyl hydroxyacetate group, a butyl hydroxyacetate group, a methyl lactate group, an ethyl lactate group, a propyl lactate group, a butyl lactate group, a methyl 3-hydroxypropionate group, an ethyl 3-hydroxypropionate group, a propyl 3-hydroxypropionate group, a butyl 3-hydroxypropionate group, a methyl 2-hydroxy-3-methylbutanoate group, a methyl methoxyacetate group, an ethyl methoxyacetate group, a propyl methoxyacetate group, a butyl methoxyacetate group, a methyl ethoxyacetate group, an ethyl ethoxyacetate group, a propyl ethoxyacetate group, a butyl ethoxyacetate group, a methyl propoxyacetate group, an ethyl propoxyacetate group, a propyl propoxyacetate group, a butyl propoxyacetate group, a methyl butoxyacetate group, an ethyl butoxyacetate group, a propyl butoxyacetate group, a butyl butoxyacetate group, a methyl 2-methoxypropionate group, an ethyl 2-methoxypropionate group, a propyl 2-methoxypropionate group, a butyl 2-methoxypropionate group, a methyl 2-ethoxypropionate group, an ethyl 2-ethoxypropionate group, a propyl 2-ethoxypropionate group, a butyl 2-ethoxypropionate group, a methyl 2-butoxypropionate group, an ethyl 2-butoxypropionate group, a propyl 2-butoxypropionate group, a butyl 2-butoxypropionate group, a methyl 3-methoxypropionate group, an ethyl 3-methoxypropionate group, a propyl 3-methoxypropionate group, a butyl 3-methoxypropionate group, a methyl 3-ethoxypropionate group, an ethyl 3-ethoxypropionate group, a propyl 3-ethoxypropionate group, a butyl 3-ethoxypropionate group, a methyl 3-propoxypropionate group, an ethyl 3-propoxypropionate group, a propyl 3-propoxypropionate group, a butyl 3-propoxypropionate group, a methyl 3-butoxypropionate group, an ethyl 3-butoxypropionate group, a propyl 3-butoxypropionate group, a butyl 3-butoxypropionate group, and/or the like; vinyl esters including a vinyl acetate group, a vinyl propionate group, a vinyl lactate group, a vinyl butyrate group, and/or the like; and (meth) acrylates including a methyl acrylate group, an ethyl acrylate group, an n-butyl acrylate group, a methyl methacrylate group, an ethyl methacrylate group, an n-butyl methacrylate group, and/or the like, without being limited thereto.

In the description, an alkenyl group may be a linear chain or a branched chain. The carbon number is not specifically limited but may be 2 to 30, 2 to 20, or 2 to 10. Examples of the alkenyl group may include a vinyl group, a 1-butenyl group, a 1-pentenyl group, a 1,3-butadienyl aryl group, a styrenyl group, a styrylvinyl group, etc., without being limited thereto.

In the description, a direct linkage may refer to a single bond.

In the description,

“ 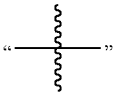 ”

refers to a position to be connected.

In the description, the term “(meth)acrylate” may refer to acrylate and methacrylate, the term “(meth)acrylic” may refer to acrylic and methacrylic, and the term “(meth) acryloyl” may refer to acryloyl and methacryloyl.

In the description, a monomer is distinguished from an oligomer and a polymer and may refer to a compound having a weight average molecular weight of 1,000 or less.

In the description, the term “bifunctional (meth)acrylate monomer” may refer to a (meth)acrylate monomer having two functional groups. For example, the bifunctional (meth) acrylate monomer may refer to a (meth)acrylate monomer including two (meth)acryloyl groups in one molecule. In a resin composition of an embodiment, the bifunctional (meth)acrylate monomer may include multiple different monomers. For example, in a resin composition of an embodiment, the bifunctional (meth)acrylate monomer may include at least one bifunctional acrylate monomer and at least one bifunctional methacrylate monomer.

The bifunctional (meth)acrylate monomer may include 1,4-butanediol di(meth)acrylate, 1,3-butylene glycol di(meth)acrylate, 1,6-hexanediol di(meth)acrylate, 1,8-octanediol di(meth)acrylate, 1,9-octanediol diacrylate, 1,12-dodecanediol di(meth)acrylate, ethylene glycol di(meth)acrylate, propylene glycol di(meth)acrylate, tripropylene glycol di(meth) acrylate, polyolefin glycol di(meth)acrylate, polyethylene glycol di(meth)acrylate, ethoxylated polypropylene glycol di(meth)acrylate, neopentyl glycol di(meth)acrylate, 2-hydroxy-1,3-dimethacryloxypropane, dioxane glycol di(meth) acrylate, glycerin di(meth)acrylate, 1,9-nonanediol di(meth) acrylate, 1,10-decanediol di(meth)acrylate, 2-methyl-1,8-octanediol di(meth)acrylate, 1,9-nonanediol di(meth) acrylate, 1,12-dodecane di(meth)acrylate, butyl ethyl propanediol di(meth)acrylate, 3-methyl-1,5-pentanediol di(meth)acrylate, dicyclopentanyl di(meth)acrylate, cyclohexane-1,4-dimethanol di(meth)acrylate, tricyclodecanedimethanol di(meth)acrylate, dimethylol dicyclopentane di(meth)acrylate, neopentyl glycol modified trimethylpropane di(meth)acrylate, and adamantane di(meth)acrylate, without being limited thereto.

In the description, the term “aryl (meth)acrylate monomer” may refer to a (meth)acrylate monomer including an aryl group. Meanwhile, the kind (e.g., type) of the aryl (meth)acrylate is not specifically limited, but may include aryl (meth)acrylate having 6 to 30, 6 to 20, or 6 to 10 ring-forming carbon atoms. For example, the aryl (meth) acrylate may include phenyl (meth)acrylate, phenoxymethyl (meth)acrylate, phenoxyethyl (meth)acrylate, phenoxyethylene glycol modified (meth)acrylate, phenoxypropylene glycol modified (meth)acrylate, hydroxyphenoxyethyl (meth) acrylate, 2-hydroxy-3-phenoxypropyl (meth)acrylate, hydroxyphenoxy ethylene glycol modified (meth)acrylate, hydroxyphenoxy propylene glycol modified (meth)acrylate, alkylphenol ethylene glycol modified (meth)acrylate, alkylphenol propylene glycol modified (meth)acrylate, ethoxylated o-phenylphenol (meth)acrylate, isobornyl (meth)acrylate, benzyl (meth)acrylate, o-tolyl (meth)acrylate, m-tolyl (meth)acrylate, p-tolyl (meth)acrylate, 2,3-xylyl (meth)acrylate, 2,4-xylyl (meth)acrylate, 2,5-xylyl (meth)acrylate, 2,6-xylyl (meth)acrylate, 3,4-xylyl (meth) acrylate, 3,5-xylyl (meth)acrylate, 1-naphthyl (meth)acrylate, 2-naphthyl (meth)acrylate, binaphthyl (meth)acrylate, and anthryl (meth)acrylate, without being limited thereto.

In the description, the term “copolymer” may refer to a polymer obtained by polymerizing two or more different monomers. The copolymer may be a random copolymer, a block copolymer, an alternating copolymer, a graft copolymer, or a crosslinked copolymer, but the present disclosure is not limited thereto.

The moisture absorbent according to an embodiment of the present disclosure includes a compound including a hydrolysable group and/or a compound including a carboxyl group. Accordingly, the moisture absorbent may chemically or physically react with moisture and play the role of absorbing moisture. In addition, in the case where the moisture absorbent of an embodiment includes a hydrolysable group, a carboxyl group may be formed after hydrolysis, and water molecules may be further physically captured, and accordingly, moisture absorption may occur. That is, moisture may be absorbed primarily through the hydrolysis of the hydrolysable group and secondarily through the physical absorption to the carboxyl group containing molecules.

In an embodiment, the hydrolysable group is not specifically limited, but may, for example, include at least one selected among an acid anhydride, an imide group, an ester group and an amide group.

In an embodiment, the hydrolysable group may be an acid anhydride represented by Formula 1 below. When the moisture absorbent includes an acid anhydride, hydrolysis reaction rate is rapid (e.g., fast), and moisture absorbing properties may be improved.

Formula 1

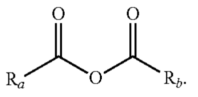

In Formula 1, $R_a$ and $R_b$ are each independently a substituted or unsubstituted alkyl group having 1 to 20 carbon atoms, a substituted or unsubstituted alkenyl group having 2 to 20 carbon atoms, a substituted or unsubstituted aryl group having 6 to 30 ring-forming carbon atoms, a substituted or unsubstituted heteroaryl group having 2 to 30 ring-forming carbon atoms, or a substituted or unsubstituted (meth)acrylate group, and $R_a$ and $R_b$ may be combined with each other to form a ring.

When $R_a$ and $R_b$ are combined with each other to form a ring, the ring formed through the combination may be a substituted or unsubstituted hydrocarbon ring, or a substituted or unsubstituted heterocycle. The hydrocarbon ring may include an aliphatic hydrocarbon ring and an aromatic hydrocarbon ring. The heterocycle may include an aliphatic heterocycle and an aromatic heterocycle. The hydrocarbon ring and the heterocycle may be monocycles or polycycles. In addition, the ring formed through the combination may be connected with another ring to form a spiro structure.

In an embodiment, the acid anhydride may include at least one selected among maleic anhydride, succinic anhydride, phthalic anhydride, dodecyl succinic anhydride, hexahydro-4-methylphthalic anhydride, methylbutenyl tetrahydrophthalic anhydride, methylendomethylene tetrahydrophthalic anhydride, methyltetrahydrophthalic anhydride, methylcyclohexene dicarboxylic anhydride, tetrahydrophthalic anhydride, trimellitic anhydride, hexahydrophthalic anhydride, benzophenone tracarboxylic anhydride, methacrylic anhydride, pentenoic anhydride, and crotonic anhydride, but the present disclosure is not limited thereto.

In an embodiment, the moisture absorbent may include at least one acid anhydride among methacrylic anhydride, pentenoic anhydride, phthalic anhydride, succinic anhydride, maleic anhydride, and crotonic anhydride, or a copolymer including at least one of them (e.g., a copolymer including a unit derived from at least one of these acid anhydrides). However, present disclosure is not limited thereto.

In an embodiment, the moisture absorbent may have a polymerization reaction group which reacts with a (meth) acrylate monomer. For example, the moisture absorbent may have a polymerization reaction group which reacts with the first (meth)acrylate monomer and the second (meth)acrylate monomer. The polymerization reaction group may refer to a functional group which may react with the first and second (meth)acrylate monomers to form a bond. In this case, at the initiation stage of the polymerization reaction, the moisture absorbent and the first and second (meth)acrylate monomers may be polymerized to form a copolymer by the polymerization reaction group. The polymerization reaction group may include an unsaturated double bond such as a (meth) acrylate group, and/or a vinyl group. In this case, the polymerization reaction group and the first and second (meth)acrylate monomers may undergo radical reaction.

The reaction between the moisture absorbent included in the copolymer of an embodiment and a water molecule may be represented by Reaction 1 below. In Reaction 1, "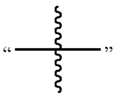"

refers to a position to be connected with an adjacent monomer unit in a copolymer. Referring to Reaction 1, the moisture absorbent may include a hydrolysable group such as an acid anhydride. Accordingly, the moisture absorbent may be hydrolyzed by a water molecule ($H_2O$) and may absorb moisture primarily through the hydrolysis reaction. In addition, the moisture absorbent of an embodiment may form a carboxyl group (COOH) after hydrolysis, and may capture water molecules secondarily through forming hydrogen bonds with the water molecules ($H_2O$). The reaction between an acid anhydride and a water molecule is shown in Reaction 1 as an example, but the present disclosure is not limited thereto.

Reaction 1

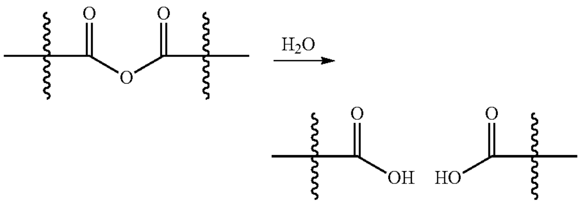

In an embodiment, the moisture absorbent may be included in about 1 to about 50 parts by weight based on the total weight of the resin composition. When the amount of the moisture absorbent is greater than about 50 parts by weight, bonding force between monomers connected as carbon chains may be too high, adhesiveness with an adjacent layer may be reduced, and exfoliation (e.g., delamination) phenomenon may arise, and when the amount is less than about 1 part by weight, a thin layer may not be dense, and the tolerance to moisture permeability may be deteriorated. That is, when the amount of the moisture absorbent is less than about 1 part by weight, the amount may be too low to provide sufficient moisture absorbing ability, and the device's tolerance to moisture permeability may be reduced.

In an embodiment, the (meth)acrylate monomer may include a first (meth)acrylate monomer which is bifunctional, and a second (meth)acrylate monomer which is different from the first (meth)acrylate monomer and includes a substituted or unsubstituted aryl group having 6 to 30 ring-forming carbon atoms. In an embodiment, the first (meth)acrylate monomer and the second (meth)acrylate monomer may be each independently included in a resin composition solely, or as a mixture of two or more thereof.

In an embodiment, the first (meth)acrylate monomer may be a bifunctional (meth)acrylate monomer having two (meth)acrylate groups. For example, the first (meth)acrylate monomer may be a photocurable monomer having two (meth)acrylate groups. Because the first (meth)acrylate monomer has such a structure, the photocuring ability of the resin composition of an embodiment may be improved, and light transmittance may increase after curing. In addition, the first (meth)acrylate may have a small (e.g., low) viscosity and may reduce the viscosity of a resin composition (including the first (meth)acrylate). Accordingly, when applied on an inorganic layer during processing, the resin composition may be uniformly applied, and thin layer properties may be improved.

In an embodiment, the first (meth)acrylate monomer may be represented by Formula 2 below.

Formula 2

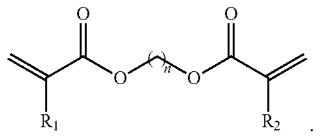

In Formula 2, $R_1$ and $R_2$ are each independently a hydrogen atom, or a substituted or unsubstituted methyl group, and "n" is an integer of 6 to 12.

In an embodiment, the second (meth)acrylate monomer may be an aryl (meth)acrylate monomer including a substituted or unsubstituted aryl group having 6 to 30 ring-forming carbon atoms.

In an embodiment, the second (meth)acrylate may be represented by Formula 3 below.

Formula 3

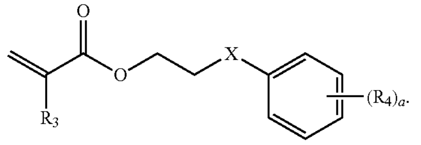

In Formula 3, $R_3$ is a hydrogen atom, or a substituted or unsubstituted methyl group, $R_4$ is a hydrogen atom, a deuterium atom, a halogen atom, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms, and X is a direct linkage or O.

In Formula 3, "a" is an integer of 0 to 5. When "a" is 2 or more, multiple $R_4$ groups are the same or different.

In an embodiment, $R_4$ may be a hydrogen atom, a substituted or unsubstituted alkyl group having 1 to 10 carbon atoms, or a substituted or unsubstituted aryl group having 6 to 20 ring-forming carbon atoms.

In an embodiment, $R_4$ may be an alkyl group having 1 to 10 carbon atoms, which is substituted or unsubstituted with a phenyl group, or a substituted or unsubstituted phenyl group.

In an embodiment, the second (meth)acrylate monomer may include an aryl group. For example, the second (meth) acrylate monomer may have a structure in which a (meth) acrylate group is connected with a substituted or unsubstituted phenyl group, or a substituted or unsubstituted phenoxy group via an ethyl group. When the second (meth) acrylate monomer having such a structure is utilized as a material for an organic layer, the plasma resistivity of the organic layer may be improved, and light-emitting properties and reliability of a light-emitting element may be improved.

In case of an encapsulation layer with multiple layers, formed by alternately forming inorganic layers and organic layers, the inorganic layer may be formed by plasma deposition. However, the organic layer may be etched by plasma, and when the plasma resistivity of the organic layer is weak, the organic layer may be damaged, and accordingly, the formation of an inorganic layer may be difficult. The resin composition according to an embodiment of the present disclosure includes the second (meth)acrylate represented by Formula 2, and an organic layer having high plasma resistivity may be achieved. Accordingly, an inorganic layer having a uniform thickness may be secured (e.g., realized), the uniform surface roughness of an encapsulation layer may be secured (e.g., realized), and as a result, the reliability of a display device may be improved.

In an embodiment, the second (meth)acrylate may include phenoxyethyl (meth)acrylate, o-methyl phenoxyethyl (meth)acrylate, p-methyl phenoxyethyl (meth)acrylate, o,p-methyl phenoxyethyl (meth)acrylate, o-ethyl phenoxyethyl (meth)acrylate, p-ethyl phenoxyethyl (meth)acrylate, p-propyl phenoxyethyl methacrylate, o,p-ethyl phenoxyethyl (meth)acrylate, o-propyl phenoxyethyl (meth)acrylate, o,p-propyl phenoxyethyl (meth)acrylate, o-methoxy phenoxyethyl (meth)acrylate, p-methoxy phenoxyethyl acrylate, o,p-methoxy phenoxyethyl (meth)acrylate, o-phenyl phenoxyethyl (meth)acrylate, p-phenyl phenoxyethyl (meth) acrylate, o-benzylphenyl phenoxyethyl (meth)acrylate, p-benzylphenyl phenoxyethyl (methyl)acrylate, 4-cumyl phenoxyethyl (meth)acrylate, 2-hydroxy-3-phenoxypropyl (meth)acrylate, and/or 2-hydroxy-3-phenyl phenoxypropyl (meth)acrylate, without being limited thereto.

In an embodiment, the first (meth)acrylate monomer may be included in about 30 to about 70 parts by weight, and the second (meth)acrylate monomer may be included in about 20 to about 50 parts by weight based on the total weight of the resin composition. When the amount ratios of the first (meth)acrylate and the second (meth)acrylate satisfy the above-described ranges (30 to 70:20 to 50), suitable or excellent photocuring ability may be achieved, and high plasma resistivity properties may be realized.

The resin composition of an embodiment may include at least one photoinitiator. When multiple photoinitiators are included, different photoinitiators may be activated by ultraviolet rays with different central wavelengths.

The photoinitiator may be any one selected among 2,2-dimethoxy-1,2-diphenylethan-1-one, 1-hydroxy-cyclohexyl-phenyl-ketone, 2-hydroxy-2-methyl-1-phenyl-1-propanone, 2-hydroxy-1-[4-(2-hydroxyethoxy)phenyl]-2-methyl-1-propanone, and 2-hydroxy-1-{4-[4-(2-hydroxy-2-methyl-propionyl)-benzyl]-phenyl}-2-methylpropan-1-one.

In addition, the photoinitiator may be any one selected among 2-methyl-1[4-(methylthio)phenyl]-2-morpholinopropan-1-one, 2-benzyl-2-dimethylamino-1-(4-morpholinophenyl)-butanone-1,2-dimethylamino-2-(4-methyl-benzyl)-1-(4-morpholin-4-yl-phenyl)-butan-1-one, 2,4,6-trimethylbenzoyl-diphenylphosphine oxide, 2,4,6-trimethylbenzoyl-diphenyl phosphinate, bis(2,4,6-trimethylbenzoyl)-phenylphosphineoxide, [1-(4-phenylsulfanylbenzoyl)heptylideneamino]benzoate, [1-[9-ethyl-6-(2-methylbenzoyl)carbazol-3-yl]ethylideneamino] acetate, and bis(2,4-cyclopentadienyl)bis[2,6-difluoro-3-(1-pyrryl)phenyl] titanium(IV).

In an embodiment, the photoinitiator included in the resin composition may be a radical initiator which is capable of curing in a wavelength region of about 360 nm to about 400 nm. That is, the photoinitiator may be activated by light having a central wavelength in a region of about 360 nm to about 400 nm. In an embodiment, the photoinitiator may be 2,4,6-trimethylbenzoyl-diphenylphosphine oxide, and/or bis (2,4,6-trimethylbenzoyl)-phenylphosphineoxide, without being limited thereto.

In an embodiment, the photoinitiator may be included in about 1 to about 5 parts by weight based on the total weight of the resin composition. When the amount of the photoinitiator corresponds to the above-described range, photopolymerization reaction may be sufficiently performed without degrading the physical properties of a coated layer.

The resin composition may further include another monomer in addition to the (meth)acrylate monomer, the photoinitiator, and the moisture absorbent. The resin composition according to the present disclosure may further include an additive as necessary. The additive may be suitably selected from common additives (e.g., well-known) in the related art to control the physical properties (e.g., required) for the resin composition. For example, the additive may include a photostabilizer, a crosslinking agent, an antioxidant, a chain transfer agent, a photosensitizer, a polymerization inhibitor, a leveling agent, a surfactant, an adhesion imparting agent, a plasticizer, a ultraviolet absorbent, a storage stabilizer, an antistatic agent, an inorganic filler, a pigment, and/or a dye, without being limited thereto. The additives may be utilized alone or in combinations.

Figure 6:
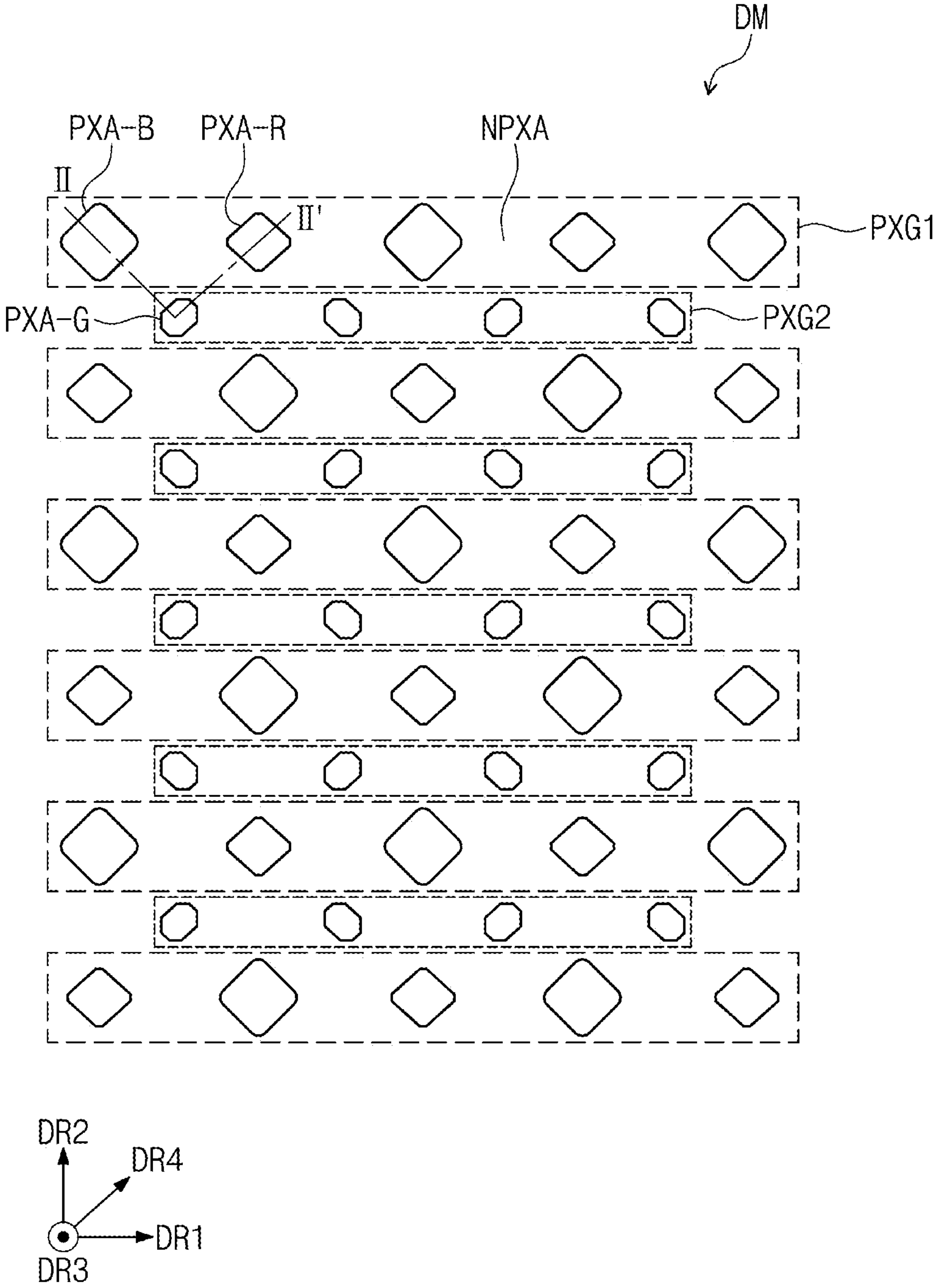
FIG. 6 is a plan view of a display module included in a display device according to an embodiment of the present disclosure.
Figure 7:
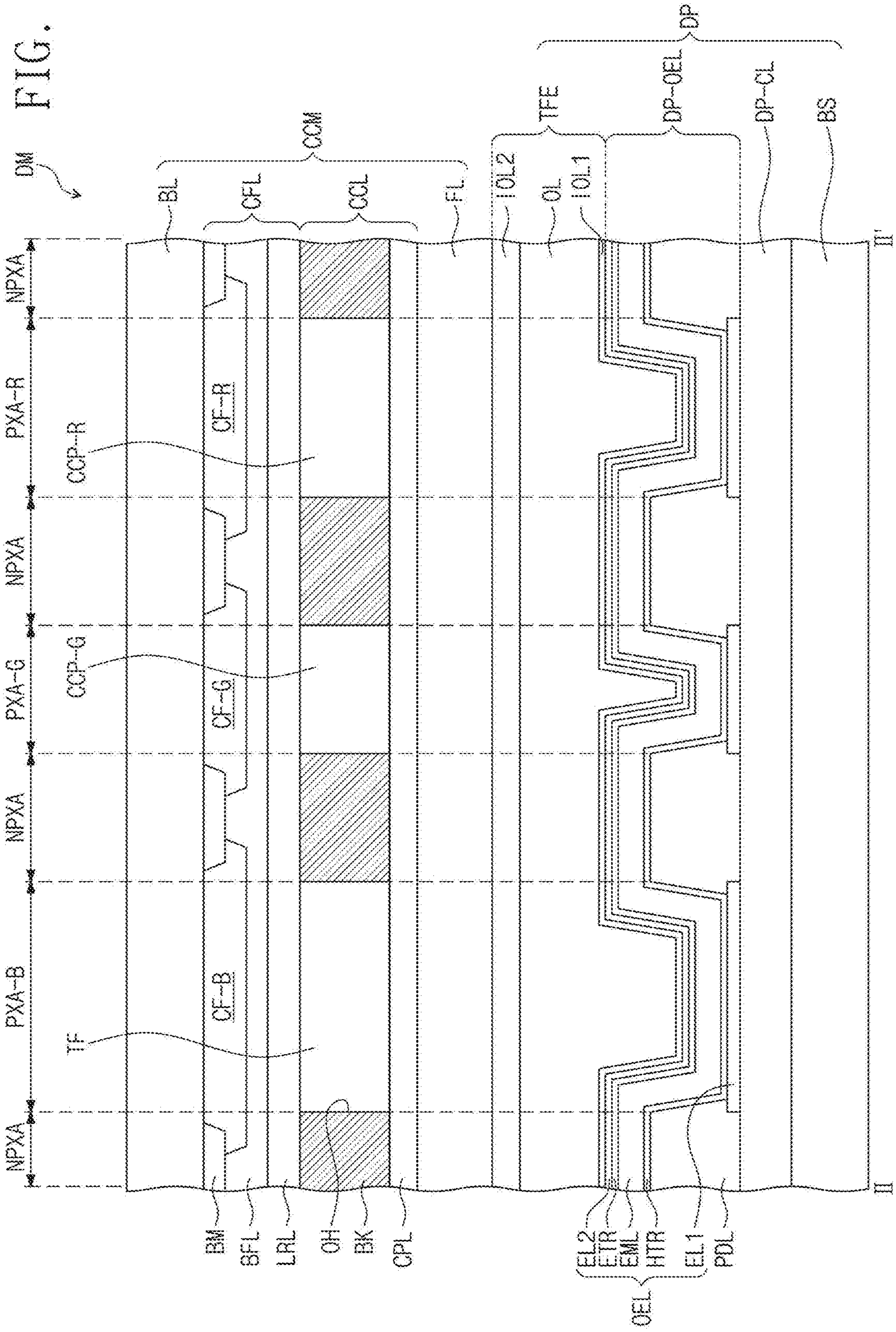
FIG. 7 is an enlarged cross-sectional view of a part of a display module included in a display device according to an embodiment of the present disclosure.

FIG. 6 is an enlarged plan view showing a part of a display module included in a display device according to an embodiment of the present disclosure. FIG. 7 is an enlarged cross-sectional view showing a part of a display module included in a display device according to an embodiment of the present disclosure. FIG. 7 shows a part corresponding to the line II-II' in FIG. 6. In the explanation on the display module DM according to an embodiment, shown in FIG. 6 and FIG. 7, the same reference symbols are provided for the configurations explained referring to FIG. 1 to FIG. 5, and the explanation thereon will be omitted.

Hereinafter, the display module DM of an embodiment, explained referring to FIG. 6 and FIG. 7, is included in the display device ES of an embodiment, explained in FIG. 1, and the display module DM may include a display panel DP and a light control member CCM.

The display module DM may include a non-luminous area NPXA and luminous areas PXA-B, PXA-G and PXA-R. Each of the luminous areas PXA-B, PXA-G and PXA-R may be an area emitting light produced from an organic electroluminescence element OEL. The areas of the luminous areas PXA-B, PXA-G and PXA-R may be different from each other, and in this case, the area may refer to an area when viewed on a plane (e.g., in a plan view).

The luminous areas PXA-B, PXA-G and PXA-R may be divided into multiple groups according to the color of light emitted. In FIG. 6 and FIG. 7, an embodiment of a display module DM including three luminous areas PXA-B, PXA-G and PXA-R, emitting blue light, green light and red light, respectively, is shown. For example, the display device ES (FIG. 1) of an embodiment may include a blue luminous area PXA-B, a green luminous area PXA-G, and a red luminous area PXA-R.

The display module DM of an embodiment, shown in FIG. 7, includes an organic electroluminescence element OEL including the emission layer EML of a display panel DP as a common layer. That is, in the display module DM of an embodiment according to FIG. 7, the display panel DP may emit light of the same wavelength region irrespective of the luminous areas PXA-B, PXA-G and PXA-R of the display module DM. For example, the display panel DP may provide the light control member CCM with blue light which is the first light.

Though not shown separately, in an embodiment of the present disclosure, an emission layer EML on which light-emitting elements corresponding to the first to third luminous areas PXA-B, PXA-G and PXA-R are patterned, respectively, may be formed, and in this case, the light-emitting elements corresponding to the first to third luminous areas PXA-B, PXA-G and PXA-R may generate lights with different colors.

In the display module DM of an embodiment, the luminous areas PXA-B, PXA-G and PXA-R may have different areas according to the color emitted from light control parts (e.g., light control unit) CCP-G and CCP-R, and a transmissive part (e.g., transmissive unit) TF. For example, in the display module DM of an embodiment, the blue luminous area PXA-B corresponding to the transmissive part TF transmitting blue light may have the greatest (e.g., largest) area, and the green luminous area PXA-G corresponding to the first light control part CCP-G generating and emitting green light may have the smallest area. However, the present disclosure is not limited thereto, and the luminous areas PXA-B, PXA-G and PXA-R may emit light of another color different from blue light, green light and red light, the luminous areas PXA-B, PXA-G and PXA-R may have the same areas, and/or the luminous areas PXA-B, PXA-G and PXA-R may be provided with a different area ratio from that shown in FIG. 6.

The luminous areas PXA-B, PXA-G and PXA-R may be areas divided by a pixel definition layer PDL. The non-luminous areas NPXA are areas between neighboring luminous areas PXA-B, PXA-G and PXA-R and may be areas corresponding to the pixel definition layer PDL.

Referring to FIG. 6, the blue luminous areas PXA-B and the red luminous areas PXA-R may be alternately arranged along a first direction DR1 to form a first group PXG1. The green luminous areas PXA-G may be arranged along the first direction DR1 to form a second group PXG2.

The first group PXG1 and the second group PXG2 may be separately disposed in a second direction DR2. Each of the first group PXG1 and the second group PXG2 may be provided in multiple. The first groups PXG1 and the second groups PXG2 may be alternately arranged along the second direction DR2.

One green luminous area PXA-G may be separately disposed from one blue luminous area PXA-B or one red luminous area PXA-R in a fourth direction DR4. The fourth direction DR4 may be a direction between the first direction DR1 and the second direction DR2.

The arrangement structure of the luminous areas PXA-B, PXA-G and PXA-R, shown in FIG. 6, may be referred to as a PENTILE® structure. PENTILE® is a registered trademark owned by Samsung Display Co., Ltd. However, in the display module DM according to an embodiment, the arrangement structure of the luminous areas PXA-B, PXA-G and PXA-R is not limited to the arrangement structure shown in FIG. 6. For example, in an embodiment, the luminous areas PXA-B, PXA-G and PXA-R may have a stripe structure in which the blue luminous area PXA-B, the green luminous area PXA-G and the red luminous area PXA-R are alternately arranged in the first direction DR1.

Referring to FIG. 7, the display panel DP according to an embodiment includes a base substrate BS, a circuit layer DP-CL disposed on the base substrate BS, and a light-emitting element layer DP-OEL disposed on the circuit layer DP-CL. The light-emitting element layer DP-OEL may include a pixel definition layer PDL, an organic electroluminescence element OEL disposed in the pixel definition layer PDL, and an encapsulation layer TFE disposed on the organic electroluminescence element OEL.

The pixel definition layer PDL may be formed utilizing a polymer resin. For example, the pixel definition layer PDL may be formed by including a polyacrylate-based resin and/or a polyimide-based resin. In addition, the pixel definition layer PDL may be formed by further including an inorganic material in addition to the polymer resin. In some embodiments, the pixel definition layer PDL may be formed by including a light absorbing material, and/or by including a black pigment and/or a black dye. In addition, the pixel definition layer PDL may be formed utilizing an inorganic material. For example, the pixel definition layer PDL may be formed by including silicon nitride ($SiN_x$), silicon oxide ($SiO_x$), silicon oxynitride ($SiO_xN_y$), and/or the like. The pixel definition layer PDL may define the luminous areas PXA-B, PXA-G and PXA-R. Through the pixel definition layer PDL, the luminous areas PXA-B, PXA-G and PXA-R and the non-luminous area NPXA may be defined (e.g., divided).

The pixel definition layer PDL may overlap with a barrier wall BK. That is, each of the multiple pixel definition layer PDL regions may be overlapped with a corresponding one of the multiple barrier walls BK.

The organic electroluminescence element OEL may include a first electrode EL1, a hole transport region HTR disposed on the first electrode EL1, an emission layer EML disposed on the hole transport region HTR, an electron transport region ETR disposed on the emission layer EML, and a second electrode EL2 disposed on the electron transport region ETR. The hole transport region HTR may include a hole injection layer adjacent to the first electrode EL1, and a hole transport layer disposed between the hole injection layer and the emission layer, and the electron transport region ETR may include an electron injection layer adjacent to the second electrode EL2 and an electron transport layer disposed between the emission layer and the electron injection layer.

On the organic electroluminescence element OEL, an encapsulation layer TFE may be disposed, and the encapsulation layer TFE may be disposed on the second electrode EL2 and encapsulate the organic electroluminescence element OEL. The encapsulation layer TFE may be directly disposed on the second electrode EL2. The encapsulation layer TFE may be one layer or a stack of multiple layers.

In FIG. 7, the encapsulation layer TFE includes one organic layer OL and two inorganic layers IOL1 and IOL2 as an illustration. However, the present disclosure is not limited thereto, and as shown in FIG. 5, the encapsulation layer TFE may include multiple organic layers and multiple inorganic layers. As shown in FIG. 7, the encapsulation layer TFE may have a shape in which two inorganic layers IOL1 and IOL2 are disposed with one organic layer OL therebetween. When the encapsulation layer TFE includes multiple organic layers and multiple inorganic layers, a repeatedly alternately stacked structure (e.g., stacked shape) of the organic layer OL and the inorganic layers IOL1 and IOL2, may be formed.

In an embodiment, the inorganic layers IOL1 and IOL2 may include any suitable materials that may protect the light-emitting element layer DP-OEL thereunder, without specific limitation, for example, may include at least one selected among silicon nitride ($SiN_x$), silicon oxide ($SiO_x$), silicon oxynitride ($SiO_xN_y$), silicon carbide (SiC), zirconium oxide ($ZrO_x$), and aluminum oxide ($Al_2O_3$).

In an embodiment, the thicknesses of the inorganic layers IOL1 and IOL2 may be the same or different. The thicknesses of the inorganic layers IOL1 and IOL2 may be each 0.5 μm to 2 μm. When the thicknesses of the inorganic layers IOL1 and IOL2 satisfy the above-described range, the permeation of moisture and oxygen may be effectively blocked, and the tolerance to moisture permeability of the encapsulation layer may be improved.

When the encapsulation layer TFE includes only the inorganic layers IOL1 and IOL2, defects such as cracks and/or pinholes may be included. In this case, the defects may act as a penetration route of oxygen and/or moisture and may induce the deterioration of a light-emitting element, and/or a dark spot may be formed to deteriorate light efficiency. When the organic layer OL is formed from the resin composition of an embodiment, moisture removing action may be served as well as delaying the penetration time of moisture and oxygen, and accordingly, when applied to a display device, tolerance to moisture permeability and reliability may be improved.

The organic layer OL of the encapsulation layer TFE according to an embodiment may include a polymer derived from the resin composition of an embodiment. That is, the organic layer OL of the encapsulation layer TFE of an embodiment may include a copolymer derived from a resin composition including a (meth)acrylate monomer, a photoinitiator, and a moisture absorbent. The same explanation on the (meth)acrylate monomer as in the explanation of the resin composition of an embodiment may be applied to the (meth)acrylate monomer in the current embodiment.

The organic layer OL of the encapsulation layer TFE included in the display device ES of an embodiment may be formed by providing a liquid phase resin composition on the inorganic layer IOL1, and curing the liquid phase resin composition provided on the inorganic layer IOL1 utilizing ultraviolet rays. However, the present disclosure is not limited thereto.

In an embodiment, the thickness of the organic layer OL may be from about 3 μm to about 30 μm. When the thickness of the organic layer OL satisfies the above-described range, suitable or excellent planarization effects may be shown, defects of the inorganic layer may be prevented or reduced, and penetration of external moisture and/or oxygen may be inhibited or reduced, thereby further improving the tolerance to moisture permeability of the encapsulation layer TFE.

The light control member CCM includes a light control layer CCL including multiple light control parts CCP-G and CCP-R. In addition, the light control member CCM may further include a color filter layer CFL and/or a base layer BL. The light control layer CCL, the color filter layer CFL and the base layer BL may be stacked in the stated order in a third direction DR3.

The light control layer CCL includes separately disposed multiple light control parts CCP-G and CCP-R. The light control layer CCL may further include a transmissive part TF which is separately disposed from the multiple light control parts CCP-G and CCP-R. The transmissive part TF and multiple light control parts CCP-G and CCP-R may be disposed between separately disposed multiple barrier walls BK.

The light control layer CCL of an embodiment may include a transmissive part TF, a first light control part CCP-G, and a second light control part CCP-R. The transmissive part TF may transmit a first light, the first light control part CCP-G may convert the first light into a second light, and the second light control part CCP-R may convert the first light into a third light. The second light may be light having a longer wavelength region than the first light, and the third light may be light having a longer wavelength region than the first light and the second light. The first light may be light in a wavelength region of about 410 nm to about 480 nm, the second light may be light in a wavelength region of about 500 nm to about 570 nm, and the third light may be light in a wavelength region of about 625 nm to about 675 nm. The first light may be source light provided from the display panel DP (FIG. 2) to the light control layer CCL.

The transmissive part TF may transmit the first light without converting (e.g., changing) its wavelength. In the first light control part CCP-G and the second light control part CCP-R, a luminous body may be included. The luminous body may be a particle capable of converting the wavelength of incident light to emit light having a different wavelength. In an embodiment, the luminous body included in the first light control part CCP-G and the second light control part CCP-R may be a quantum dot QD.

The quantum dot QD may be a particle converting the wavelength of light provided. The quantum dot may be selected from a Group II-VI compound, a Group III-VI compound, a Group compound, a Group III-V compound, a Group III-II-V compound, a Group IV-VI compound, a Group IV element, a Group IV compound, and combinations thereof.

The Group II-VI compound may be selected from the group consisting of a binary compound selected from the group consisting of CdSe, CdTe, ZnS, ZnSe, ZnTe, ZnO, HgS, HgSe, HgTe, MgSe, MgS, and a mixture thereof; a ternary compound selected from the group consisting of CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and a mixture thereof; and a quaternary compound selected from the group consisting of HgZnTeS, CdZnSeS, CdZnSeTe, CdZnSTe, CdHgSeS, CdHgSeTe, CdHgSTe, HgZnSeS, HgZnSeTe, HgZnSTe, and a mixture thereof.

The Group III-VI compound may include a binary compound such as $In_2S_3$, and/or $In_2Se_3$, a ternary compound such as $InGaS_3$, and/or $InGaSe_3$, or one or more combinations thereof.

The Group compound may be selected from a ternary compound selected from the group consisting of AgInS, $AgInS_2$, CuInS, $CuInS_2$, $AgGaS_2$, $CuGaS_2$, $CuGaO_2$, $AgGaO_2$, $AgAlO_2$ and mixtures thereof, and a quaternary compound such as $AgInGaS_2$, and/or $CuInGaS_2$.

The Group III-V compound may be selected from the group consisting of a binary compound selected from the group consisting of GaN, GaP, GaAs, GaSb, AlN, AlP, AlAs, AlSb, InN, InP, InAs, InSb, and mixtures thereof; a ternary compound selected from the group consisting of GaNP, GaNAs, GaNSb, GaPAs, GaPSb, AlNP, AlNAs, AlNSb, AlPAs, AlPSb, InGaP, InAlP, InNP, InNAs, InNSb, InPAs, InPSb, and mixtures thereof; and a quaternary compound selected from the group consisting of GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and mixtures thereof. In some embodiments, the Group III-V compound may further include a II group metal. For example, InZnP, etc. may be selected as a Group III-II-V compound.

The Group IV-VI compound may be selected from the group consisting of a binary compound selected from the group consisting of SnS, SnSe, SnTe, PbS, PbSe, PbTe, and mixtures thereof; a ternary compound selected from the group consisting of SnSeS, SnSeTe, SnSTe, PbSeS, PbSeTe, PbSTe, SnPbS, SnPbSe, SnPbTe, and mixtures thereof; and a quaternary compound selected from the group consisting of SnPbSSe, SnPbSeTe, SnPbSTe, and mixtures thereof. The Group IV element may be selected from the group consisting of Si, Ge, and a mixture thereof. The Group IV compound may be a binary compound selected from the group consisting of SiC, SiGe, and a mixture thereof.

The binary compound, the ternary compound, or the quaternary compound may be present at a uniform concentration in a particle or may be present at a partially different concentration distribution state in the same particle. In addition, the quantum dot may have a core/shell structure in which one quantum dot is around (e.g., wraps) another quantum dot. In the core/shell structure, there may be a concentration gradient in which the concentration of an element present in the shell is decreased toward the center of the core.

In some embodiments, the quantum dot may have the above-described core-shell structure including a core including a nanocrystal and a shell around (e.g., wrapping) the core. The shell of the quantum dot may act as a protection layer for preventing or reducing the chemical deformation of the core to maintain semiconductor properties and/or as a charging layer for imparting the quantum dot with electrophoretic properties. The shell may have a single layer or a multilayer structure. Examples of the shell of the quantum dot may include a metal or non-metal oxide, a semiconductor compound, or combinations thereof.

For example, the metal or non-metal oxide may include a binary compound such as $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $Co_3O_4$ and/or NiO, and/or a ternary compound such as $MgAl_2O_4$, $CoFe_2O_4$, $NiFe_2O_4$ and/or $CoMn_2O_4$, but the present disclosure is not limited thereto.

Also, the semiconductor compound may include CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, AlSb, etc., but the present disclosure is not limited thereto.

The quantum dot may have a full width of half maximum (FWHM) of emission wavelength spectrum of about 45 nm or less, for example, about 40 nm or less, or, about 30 nm or less. Within these ranges, color purity or color reproducibility may be improved. In addition, light emitted via such quantum dot is emitted in all directions, and light viewing angle may be thereby improved.

In addition, the shape of the quantum dot may be any suitable shape generally utilized in the related art, without specific limitation. For example, the shape of spherical, pyramidal, multi-arm, or cubic nanoparticle, nanotube, nanowire, nanofiber, nanoplate particle, etc. may be utilized.

The quantum dot may control the color of light emitted according to the particle size, and accordingly, the quantum dot may have various suitable emission colors such as blue, red and/or green. Smaller particle size of the quantum dot leads to the emission of light in a shorter wavelength region. For example, the particle size of the quantum dot emitting green light may be smaller than the particle size of the quantum dot emitting red light.

Barrier walls BK may define an opening part OH to expose a region overlapped with color filters CF-B, CF-G and CF-R. The transmissive part TF and the light control parts CCP-G and CCP-R may fill up the opening part OH.

The light control member CCM may further include a color filter layer CFL disposed on the light control layer CCL. In an embodiment, the color filter layer CFL may be disposed between the base layer BL and the light control layer CCL. The color filter layer CFL may include a shading part BM and a color filter CF.

The shading part BM may be disposed on the base layer BL. Multiple shading parts BM may be separately disposed, while exposing a portion of the base layer BL. Between the shading parts BM, color filters CF-B, CF-G and CF-R may be disposed.

The color filter layer CFL may include adjacently disposed multiple color filters CF-B, CF-G and CF-R on a plane (e.g., in a plan view). That is, the color filter layer CFL may include a first color filter CF-B transmitting the first light, a second color filter CF-G transmitting the second light, and a third color filter CF-R transmitting the third light. For example, the first color filter CF-B may be a blue filter, the second color filter CF-G may be a green filter, and the third color filter CF-R may be a red filter.

Each of the color filters CF-B, CF-G and CF-R may include a polymer photosensitive resin, and a pigment and/or dye. The first color filter CF-B may include a blue pigment and/or dye, the second color filter CF-G may include a green pigment and/or dye, and the third color filter CF-R may include a red pigment and/or dye.

However, the present disclosure is not limited thereto, and the first color filter CF-B may not include any pigment and/or dye. The first color filter CF-B may include a polymer photosensitive resin but exclude a pigment and/or dye. The first color filter CF-B may be transparent. The first color filter CF-B may be formed utilizing a transparent photosensitive resin.

The shading part BM may be a black matrix. The shading part BM may be formed by including an organic shading material or an inorganic shading material, including a black pigment and/or a black dye. The shading part BM may prevent or reduce a light leakage phenomenon and divide (e.g., define) boundaries between adjacent color filters CF-B, CF-G and CF-R.

Multiple shading parts BM may be separately disposed, and each of the shading parts BM may be overlapped with each of the multiple barrier walls BK, correspondingly.

The color filter layer CFL may further include a low refractive layer LRL. The low refractive layer LRL may be disposed between the color filters CF-B, CF-G and CF-R, and the light control layer CCL. The refractive index of the low refractive layer LRL may be from about 1.1 to about 1.5. The refractive index value of the low refractive layer may be controlled by the ratio of hollow inorganic particles, and/or voids, included in the low refractive layer LRL.

The color filter layer CFL may further include a buffer layer BFL. In FIG. 7, the buffer layer BFL is disposed between the color filters CF-B, CF-G and CF-R, and the low refractive layer LRL, but the present disclosure is not limited thereto. For example, the buffer layer BFL may be disposed adjacent to the light control layer CCL on the low refractive layer LRL. The buffer layer BFL may be a protection layer protecting the low refractive layer LRL and/or the color filters CF-B, CF-G and CF-R. The buffer layer BFL may include at least one inorganic material among silicon nitride, silicon oxide and silicon oxynitride. The buffer layer BFL may be formed as a single layer or multiple layers.

The base layer BL may be a member providing a base surface for disposing the color filter layer CFL and the light control layer CCL. The base layer BL may be a glass substrate, a metal substrate, a plastic substrate, and/or the like. However, the present disclosure is not limited thereto, and the base layer BL may be an inorganic layer, an organic layer, or a composite material layer.

The light control layer CCL may further include a capping layer CPL. The capping layer CPL may be disposed on the light control part CCP and the barrier wall BK. The capping layer CPL may play the role of blocking or reducing the penetration of moisture and/or oxygen (hereinafter, referred to as "moisture/oxygen"). The capping layer CPL may be disposed on the light control part CCP to block or reduce the exposure of the light control part CCP to moisture/oxygen. The capping layer CPL may include one or more inorganic layers. That is, the capping layer CPL may be formed by including an inorganic material. For example, the capping layer CPL may be formed by including silicon nitride, aluminum nitride, zirconium nitride, titanium nitride, hafnium nitride, tantalum nitride, silicon oxide, aluminum oxide, titanium oxide, tin oxide, cerium oxide and/or silicon oxynitride, and/or a metal thin film to secure (e.g., allow) light transmittance. In some embodiments, the capping layer CPL may further include an organic layer. The capping layer CPL may be composed of a single layer or multiple layers.

The filling layer FL may be disposed between the encapsulation layer TFE and the light control layer CCL. When the light control layer CCL includes the capping layer CPL, the filling layer FL may be disposed between the outermost inorganic layer IOL2 of the encapsulation layer TFE and the capping layer CPL.

In an embodiment, the filling layer FL may include the moisture absorbent of an embodiment. More particularly, the filling layer FL may include a copolymer including the (meth)acrylate monomer and a moisture absorbent of an embodiment. When the filling layer FL includes the moisture absorbent, moisture penetrated due to the defects of the capping layer CPL and/or the inorganic layers IOL1 and IOL2 may be absorbed, and the tolerance to moisture permeability and reliability of a display device may be even further improved.

In the display module DM of an embodiment, the base layer BL disposed on the color filter layer CFL may be omitted. In this case, the color filter layer CFL may be formed on the light control layer CCL through a continuous process. That is, in the display module DM of an embodiment, the light control layer CCL and the color filter layer CFL may be formed in order on the display panel DP through a continuous process.

Hereinafter, the resin composition and a display device utilizing the same according to an embodiment of the present disclosure, will be explained specifically referring to example embodiments and a comparative embodiment. However, the embodiments are only for illustrations to assist the understanding of the present disclosure, and the scope of the present disclosure is not limited thereto.

EXAMPLES

1. Preparation of Resin Composition

Figure 8:
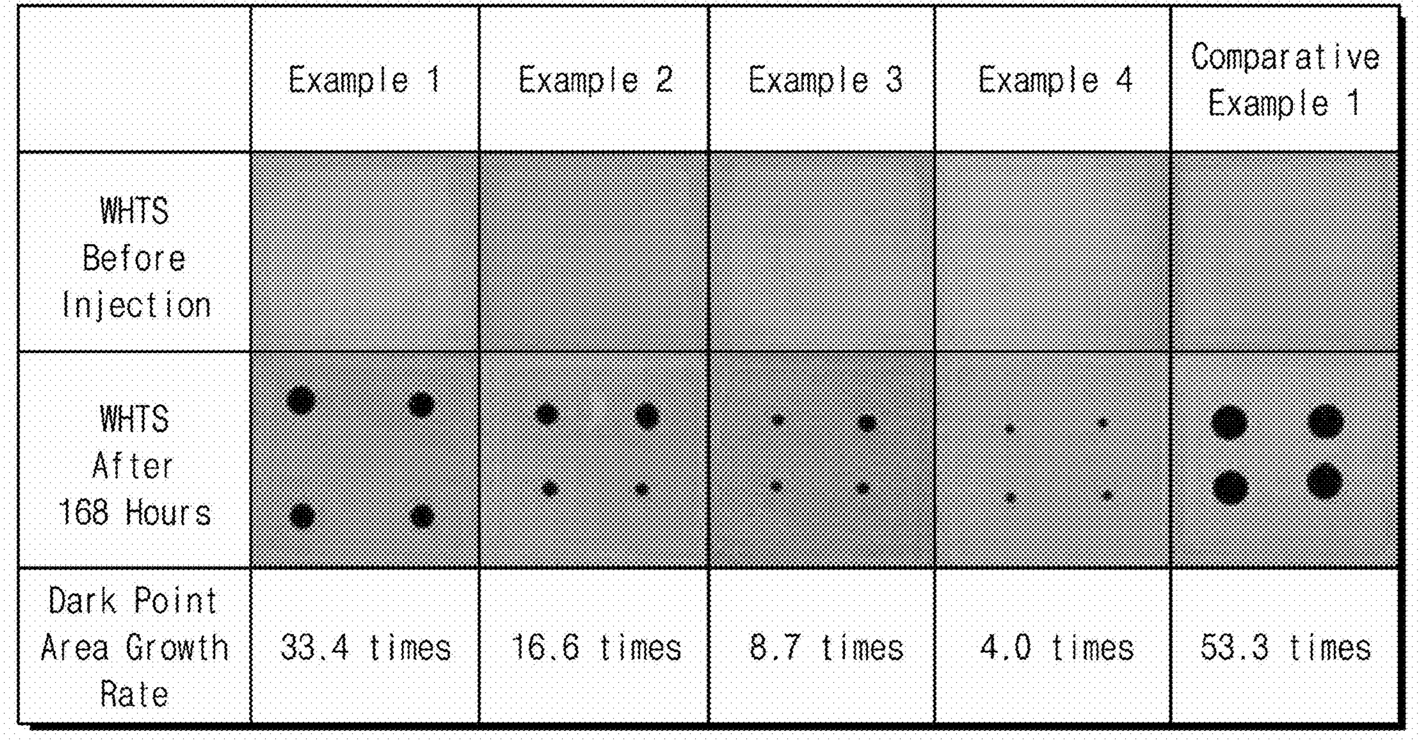
FIG. 8 is a table showing dark spot area growth rates of display panels manufactured utilizing resin compositions of Examples 1-4 and Comparative Example 1.

The resin compositions of Examples 1 to 4 were prepared by a preparation method below. Table 1 below shows the amount ratios of first and second (meth)acrylates, photoinitiators, and moisture absorbents, utilized in Examples 1 to 4, each of which was subject to the wet high temperature storage (WHTS) test, the results of which are shown in FIG. 8. After mixing the constituting materials of Examples 1 to 4 under a 50% relative humidity (RH) condition in the respective weight ratios shown in Table 1, 3 wt % of a photoinitiator was added thereto based on 100 wt % of the amount of the total resin composition. Then, the materials were stirred for about 3 hours to prepare the respective resin compositions. As the materials utilized for the resin compositions of Examples 1 to 4 below, dimethacrylate was utilized as the first (meth)acrylate, phenoxy group-containing acrylate was utilized as the second (meth)acrylate, and an acid anhydride was utilized as the moisture absorbent.

TABLE 1

| Material | Example 1 | Example 2 | Example 3 | Example 4 |
|---|---|---|---|---|
| First (meth)acrylate | 60 | 57.5 | 55 | 52.5 |
| Second (meth)acrylate | 40 | 37.5 | 35 | 32.5 |
| Moisture absorbent | — | 5 | 10 | 15 |
| Photoinitiator | 3 wt % of total mass | 3 wt % of total mass | 3 wt % of total mass | 3 wt % of total mass |

2. Evaluation of Reliability

FIG. 8 shows the wet high temperature storage (WHTS) test results measured from the light-emitting elements of Examples 1 to 4 and Comparative Example 1. Examples 1 to 4 correspond to light-emitting elements formed from resin compositions of Examples 1 to 4, having the compositions shown in Table 1 above, and Comparative Example 1 corresponds to a light-emitting element formed from a resin composition not including the first and second (meth)acrylates and the moisture absorbent of an embodiment. Here, the wet high temperature storage (WHTS) test is a storage test in a high temperature and high humidity state, and the evaluation was conducted after keeping Examples 1 to 4 and Comparative Example 1 in an oven with a temperature of about 85° C. and a relative humidity of about 85% for about 168 hours, and followed by evaluating the appearance of dark spots and area growth rates of the dark spots.

As for Examples 1 to 4 and Comparative Example 1, the surface area of the dark spots was observed through a microscope apparatus. The area growth rate of the dark spots in the light-emitting elements according to Examples and Comparative Example were each measured utilizing the equation below. In the following equation, D represents the area growth rate of the dark spot, $SA_1$ represents a surface area of the dark spot at a time the dark spot was generated, and $SA_2$ represents a surface area of the dark spot after 168 hours of the WVTR test.

$$D=SA_2/SA_1 \quad \text{Equation}$$

In manufacturing the light-emitting elements, first, a first inorganic layer was formed on a light-emitting element layer, and cracks were formed artificially (e.g., intentionally) in the first inorganic layer utilizing a probe station. Then, a respective resin composition of each of Examples 1 to 4 and Comparative Example 1 was applied on the first inorganic layer and cured to form an organic layer. On the organic layer, a second inorganic layer was formed to thereby manufacture a light-emitting element including a thin film encapsulation layer having a three-layer stacked structure.

Then, after forming the cracks and after about 168 hours from the injection (e.g., from the beginning) of the wet high temperature storage (WHTS) test, the area growth rate of dark spots was calculated and shown in FIG. 8. Referring to FIG. 8, the row labeled with WHTS Before Injection shows the surface of each sample before the WHTS test started, and the row labeled with WHTS After 168 Hours shows the surface of each sample after 168 hours of the WHTS test. It can be confirmed that Examples 1 to 4 each show higher tolerance to moisture permeability than Comparative Example 1. In case of Comparative Example 1, the encapsulation layer did not include the first and second (meth) acrylates and the moisture absorbent according to an embodiment, and the area growth rate of dark spots generated on the surface of the top substrate of a display device was up to about 53.3 times. On the contrary, in case of Example 1 in which the encapsulation layer included the first and second (meth)acrylates according to an embodiment, it can be confirmed that the area growth rate of dark spots after WHTS test was reduced to about 33.4 times or less. Further, in cases of Examples 2 to 4, in which the encapsulation layer included the first and second (meth) acrylates according to an embodiment, and the moisture absorbent, all showed reduced area growth rates of dark spots after WHTS test of about 16.6 times or less. Through this, it can be confirmed that the tolerance to moisture and moisture permeability were further improved. In addition, it can be confirmed that the area growth rate of the dark spots was reduced with the increase of the amount ratio of the moisture absorbent, and reduced to about 4 times when the amount ratio of the moisture absorbent was 15%.

Figure 9A:
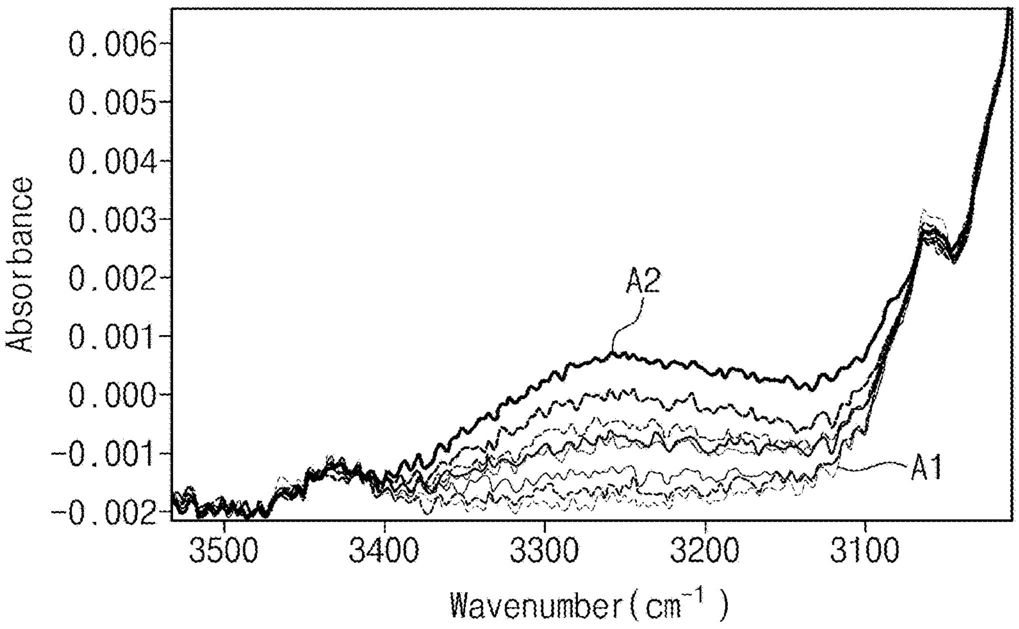
FIG. 9A and FIG. 9B are graphs showing Fourier Transform Infrared Spectrometer (FT-IR) analysis results according to embodiments of the present disclosure.
Figure 9B:
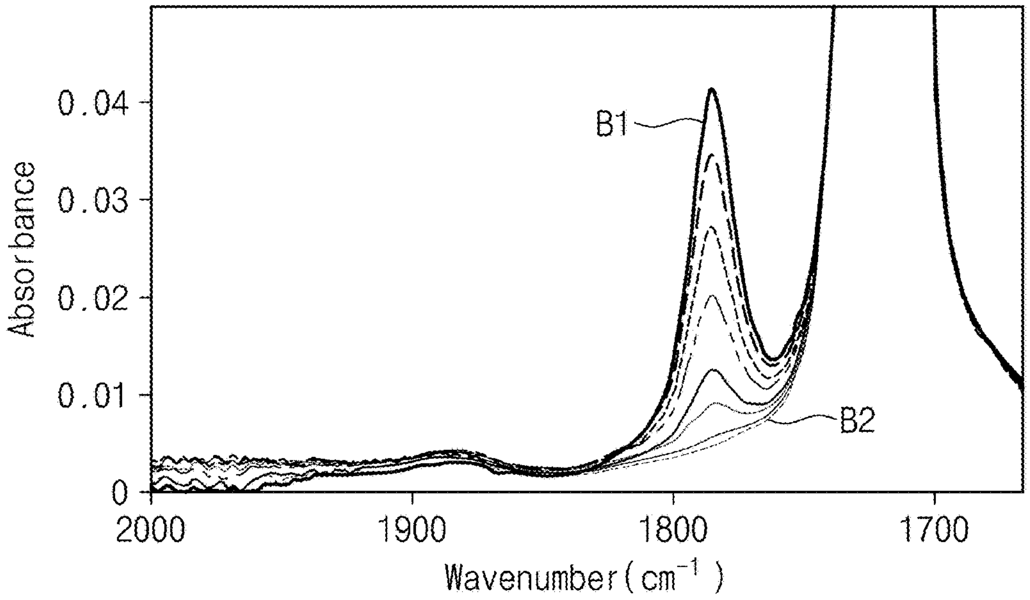

FIG. 9A and FIG. 9B are graphs showing Fourier Transform Infrared spectrometer (FT-IR) analysis results according to an embodiment of the present disclosure. More particularly, FIG. 9A and FIG. 9B are graphs obtained by measuring absorbance of vibration bonding in accordance with wavelength utilizing a Fourier Transform Infrared Spectrometer (FTIR) with respect to Example 4. The absorbance change of an acid anhydride group and a carboxyl group are shown according to time from immediately after the beginning of the wet high temperature storage (WHTS) test to about 168 hours. In FIG. 9A, A1 is a spectrum of a carboxyl group measured immediately after the WHTS test is started, and A2 is a spectrum of a carboxyl group measured after about 168 hours of the WHTS test. In FIG. 9B, B1 is a spectrum of an acid anhydride measured immediately after the WHTS test is started, and B2 is a spectrum of an acid anhydride measured after about 168 hours of the WHTS test. In FIG. 9A, spectrums between A1 and A2 show the gradual change according to the lapse of time after WHTS test is started, and in FIG. 9B, spectrums between B1 and B2 show the gradual change according to the lapse of time after WHTS test is started.

Referring to FIG. 9A, it can be confirmed that the intensity of an O—H stretching vibration peak of the carboxyl group at around 3300 $cm^{-1}$, which was not shown immediately after WHTS test is started (A1), increased according to the lapse of time after WHTS test is started, and reached the maximum after about 168 hours (A2). In addition, referring to FIG. 9B, it can be confirmed that the intensity of a C═O stretching vibration peak of the acid anhydride at around 1780 $cm^{-1}$, which was shown immediately after WHTS test (B1) is started, decreased according to the lapse of time after WHTS test is started, and reached the minimum and almost disappeared after about 168 hours (B2). From these results, it can be confirmed that with the increase of the penetration of moisture, the acid anhydride, which is the moisture absorbent, is hydrolyzed, and the amount of the carboxyl group (COOH) increases.

The resin composition and the display device utilizing the same according to an embodiment include a moisture absorbent including a hydrolysable group. In an embodiment, a copolymer including the moisture absorbent may be formed after curing by being included in the resin composition. Because the moisture absorbent is bonded to a polymer to form a copolymer, an organic layer may be provided with moisture absorbing properties, and with the further increase of the lag time of moisture permeation of an organic layer, tolerance to moisture permeability may be improved, and the reliability of a display device may be improved.

In related art, in order to protect an organic electroluminescence element which is weak (e.g., sensitive) to moisture or oxygen, a hybrid (e.g., hybrid type) thin film encapsulation having an organic/inorganic stack structure was applied as a barrier film. In this case, the organic layer dislocates defects generated in the inorganic layer to increase the lag time of moisture permeation, but the moisture barrier properties were not improved (e.g., influenced) much, and there were defects (or weakness) on moisture permeability.

The resin composition and the display device utilizing the same according to an embodiment of the present disclosure include a molecule having moisture absorbing functionality, and the related art organic layer may be provided with moisture absorbing properties to improve the reliability of a display device. In addition, the lag time of moisture permeation may increase when compared with the related art organic layer, and the number of stacking barriers of an encapsulation layer utilized for production may be reduced. That is, because the number of organic/inorganic stacking layers (e.g., required) for effective barrier properties may be reduced, the manufacturing time (e.g., tack time) may be reduced, and accordingly, the productivity of a display device may be improved.

The resin composition of an embodiment includes a moisture absorbent containing a hydrolysable group and a carboxylic group, and may show improved tolerance to moisture and/or moisture permeability.

The display device of an embodiment includes a copolymer containing a (meth)acrylate monomer and a moisture absorbent, and may show improved tolerance to moisture and moisture permeability, and improved reliability.

Although example embodiments of the present disclosure have been described, it is understood that various suitable changes and modifications can be made by one of ordinary skill in the art within the spirit and technical scope of the present disclosure described in the appended claims, and equivalents thereof.

Accordingly, the technical scope of the present disclosure is to be determined by the following claims, and equivalents thereof, and shall not be restricted or limited by the foregoing detailed description.

What is claimed is:

1. A resin composition comprising:

a (meth)acrylate monomer comprising a second (meth) acrylate monomer represented by Formula 3;

a photoinitiator; and a moisture absorbent, wherein the moisture absorbent comprises:

a hydrolysable group represented by Formula 1; and a carboxylic group after hydrolysis:

Formula 3

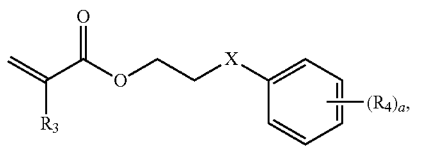

wherein in Formula 3, $R_3$ is a hydrogen atom or a substituted or unsubstituted methyl group, $R_4$ is a hydrogen atom, a deuterium atom, a halogen atom, a substituted or unsubstituted alkyl group having 1 to 20 carbon atoms, a substituted or unsubstituted aryl group having 7 to 30 ring-forming carbon atoms, or a substituted or unsubstituted heteroaryl group having 2 to 30 ring-forming carbon atoms, X is a direct linkage or O, and a is an integer of 0 to 5, Formula 1

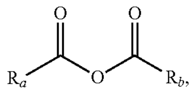

wherein in Formula 1, $R_a$ and $R_b$ are each independently a substituted or unsubstituted alkyl group having 1 to 20 carbon atoms, a substituted or unsubstituted alkenyl group having 2 to 20 carbon atoms, a substituted or unsubstituted aryl group having 6 to 30 ring-forming carbon atoms, a substituted or unsubstituted heteroaryl group having 2 to 30 ring-forming carbon atoms, or a substituted or unsubstituted (meth)acrylate group, and $R_a$ and $R_b$ are optionally combined with each other to form a ring, and wherein the moisture absorbent excludes maleic anhydride.

2. The resin composition of claim 1, wherein the (meth) acrylate monomer further comprises:

a first (meth)acrylate monomer which is bifunctional and different from the second (meth)acrylate monomer.

3. The resin composition of claim 1, wherein the hydrolysable group further comprises at least one selected among an imide group, an ester group, and an amide group.

4. The resin composition of claim 2, comprising:

about 30 to about 70 parts by weight of the first (meth) acrylate monomer, about 20 to about 50 parts by weight of the second (meth)acrylate monomer, about 1 to about 5 parts by weight of the photoinitiator, and about 1 to about 50 parts by weight of the moisture absorbent, each based on a total weight of the resin composition.

5. The resin composition of claim 2, wherein the moisture absorbent comprises a polymerization reaction group to react with the first (meth)acrylate monomer and the second (meth)acrylate monomer.

6. The resin composition of claim 2, wherein the first (meth)acrylate monomer is represented by Formula 2:

Formula 2

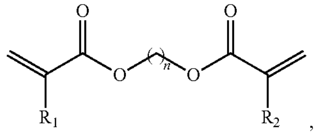

and wherein in Formula 2, $R_1$ and $R_2$ are each independently a hydrogen atom, or a substituted or unsubstituted methyl group, and n is an integer of 6 to 12.

7. A display device comprising:

a light-emitting element layer;

an encapsulation layer on the light-emitting element layer and comprising one or more organic layers;

a filling layer on the encapsulation layer; and a light control layer on the filling layer, wherein at least one selected among the one or more organic layers and the filling layer comprises a copolymer of a monomer mixture comprising a (meth) acrylate monomer and a moisture absorbent, the moisture absorbent comprises a compound comprising a hydrolysable group represented by Formula 1 and a carboxylic group after hydrolysis, and the (meth)acrylate monomer comprises a second (meth) acrylate monomer represented by Formula 3:

Formula 3

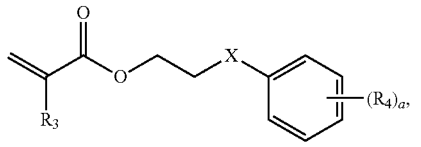

wherein in Formula 3, $R_3$ is a hydrogen atom or a substituted or unsubstituted methyl group, $R_4$ is a hydrogen atom, a deuterium atom, a halogen atom, a substituted or unsubstituted alkyl group having 1 to 20 carbon atoms, a substituted or unsubstituted aryl group having 7 to 30 ring-forming carbon atoms, or a substituted or unsubstituted heteroaryl group having 2 to 30 ring-forming carbon atoms, X is a direct linkage or O, and a is an integer of 0 to 5, Formula 1

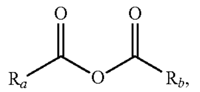

wherein in Formula 1, $R_a$ and $R_b$ are each independently a substituted or unsubstituted alkyl group having 1 to 20 carbon atoms, a substituted or unsubstituted alkenyl group having 2 to 20 carbon atoms, a substituted or unsubstituted aryl group having 6 to 30 ring-forming carbon atoms, a substituted or unsubstituted heteroaryl group having 2 to 30 ring-forming carbon atoms, or a substituted or unsubstituted (meth)acrylate group, and $R_a$ and $R_b$ are optionally combined with each other to form a ring, and wherein the moisture absorbent excludes maleic anhydride.

8. The display device of claim 7, wherein the (meth) acrylate monomer further comprises:

a first (meth)acrylate monomer which is bifunctional and different from the second (meth)acrylate monomer.

9. The display device of claim 7, wherein the hydrolysable group further comprises at least one selected among an imide group, an ester group, and an amide group.

10. The display device of claim 7, wherein the encapsulation layer further comprises one or more inorganic layers, and the one or more organic layers and the one or more inorganic layers are alternately stacked.

11. The display device of claim 10, wherein the one or more inorganic layers comprises at least one selected among $SiN_x$, $SiO_x$, $SiO_xN_y$, SiC, $ZrO_x$, and $Al_2O_3$, and is formed by plasma chemical vapor deposition and/or sputtering.

12. The display device of claim 11, wherein a thickness of each of the one or more organic layers is from about 3 μm to about 30 μm, and a thickness of each of the one or more inorganic layers is from about 0.5 μm to about 2 μm.

13. The display device of claim 7, wherein the encapsulation layer is to encapsulate the light-emitting element layer.

14. The display device of claim 8, wherein the first (meth)acrylate monomer is represented by Formula 2:

Formula 2

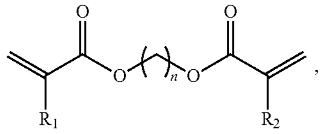

wherein in Formula 2, $R_1$ and $R_2$ are each independently a hydrogen atom, or a substituted or unsubstituted methyl group, and n is an integer of 6 to 12.

15. The display device of claim 7, wherein the light control layer comprises a quantum dot.

16. The display device of claim 7, wherein the light-emitting element layer comprises a light-emitting element to generate a first light, and the light control layer comprises:

a transmissive part to transmit the first light;

a first light control part to convert the first light into a second light; and a second light control part to convert the first light into a third light.

17. The display device of claim 16, further comprising a color filter layer on the light control layer, wherein the color filter layer comprises:

a first color filter overlapped with the transmissive part and to transmit the first light;

a second color filter overlapped with the first light control part, and to block the first light and to transmit the second light; and a third color filter overlapped with the second light control part, and to block the first light and to transmit the third light.

* * * * *